United States Patent
Aiso

(10) Patent No.: US 7,982,461 B2
(45) Date of Patent: Jul. 19, 2011

(54) MAGNETIC SENSOR AND MANUFACTURING METHOD THEREFOR

(75) Inventor: Kokichi Aiso, Hamamatsu (JP)

(73) Assignee: Yamaha Corporation, Hamamatsu-shi, Shizuoka-Ken (JP)

( * ) Notice: Subject to any disclaimer, the term of this patent is extended or adjusted under 35 U.S.C. 154(b) by 470 days.

(21) Appl. No.: 12/105,923

(22) Filed: Apr. 18, 2008

(65) Prior Publication Data

US 2008/0297954 A1    Dec. 4, 2008

(30) Foreign Application Priority Data

Apr. 19, 2007   (JP) ................. 2007-110475

(51) Int. Cl.
*G01B 7/30* (2006.01)
*G01R 33/02* (2006.01)

(52) U.S. Cl. .......... 324/252; 324/207.21; 338/32 R
(58) Field of Classification Search .......... 324/252, 324/207.21; 338/32 R
See application file for complete search history.

(56) References Cited

U.S. PATENT DOCUMENTS

| 7,023,310 B2 * | 4/2006 | Oohashi et al. ........ 335/306 |
| 2006/0176142 A1 | 8/2006 | Naito et al. |

FOREIGN PATENT DOCUMENTS

| JP | 01-250875 | 10/1989 |
| JP | 07-245433 | 9/1995 |
| JP | 2004-006752 A | 1/2004 |
| JP | 2005-116828 | 4/2005 |
| JP | 2005-260064 | 9/2005 |
| JP | 2006-261400 | 9/2006 |
| JP | 2006-275765 | 10/2006 |
| JP | 2006-308573 | 11/2006 |
| WO | WO-2006-098367 | 9/2006 |
| WO | WO-2006-098431 | 9/2006 |

* cited by examiner

*Primary Examiner* — Reena Aurora
(74) *Attorney, Agent, or Firm* — Dickstein Shapiro LLP

(57) ABSTRACT

A magnetic sensor includes a plurality of giant magnetoresistive elements, each of which includes a free layer, a conductive layer, and a pin layer sequentially laminated on a substrate, wherein the pin layer formed by sequentially laminating a first magnetic layer, an Ru layer, a second magnetic layer, and an antiferromagnetic layer is subjected to magnetization heat treatment so as to fix the magnetization direction thereof. The first and second magnetic layers differ from each other in thickness and magnetic moment thereof, and the thickness of the Ru layer ranges from 4 Å to 10 Å. The magnetization heat treatment is performed so as to maintain an anti-parallel state between the first and second magnetic layers. In order to detect magnetic fields in three-axial directions, one giant magnetoresistive element is formed using a planar surface, and the other giant magnetoresistive elements are formed using respective slopes on the substrate.

11 Claims, 13 Drawing Sheets

MAGNETIC SENSOR AND MANUFACTURING METHOD THEREFOR

BACKGROUND OF THE INVENTION

1. Field of the Invention

The present invention relates to magnetic sensors, each of which includes a plurality of giant magnetoresistive elements formed on a single substrate so as to detect magnetic field intensities (or magnetic field strengths) in two-axial directions or three-axial directions. The present invention also relates to manufacturing methods of magnetic sensors.

The present application claims priority on Japanese Patent Application No. 2007-110475, the content of which is incorporated herein by reference.

2. Description of the Related Art

As elements used for magnetic sensors, giant magnetoresistive elements (GMR elements) and tunnel magnetoresistive elements (TMR elements) have been conventionally known. Each of the conventionally-known magnetoresistive elements includes a pin layer whose magnetization direction is pinned (or fixed) and a free layer whose magnetization direction varies in response to an external magnetic field, wherein it shows a resistance to suit the mutual relationship between the magnetization direction of the pin layer and the magnetization direction of the free layer. Magnetic sensors using magnetoresistive elements have been disclosed in various documents such as Patent Document 1 and Patent Document 2.

Patent Document 1: Japanese Unexamined Patent Application Publication No. 2005-260064.
Patent Document 2: Japanese Unexamined Patent Application Publication No. 2006-261400.

Patent Document 1 teaches a magnetic sensor that is constituted using a plurality of giant magnetoresistive elements each having a synthetic antiferromagnetic (SAF) structure, in which a Ru layer (where Ru stands for ruthenium) is inserted into a magnetic layer of a pin layer formed on the surface of a substrate. Each of the giant magnetoresistive elements detects a magnetic field intensity lying in one direction on the surface of the substrate. A plurality of giant magnetoresistive elements, which detect magnetic field intensities in different directions, is formed on the surface of the substrate. This makes it possible for the magnetic sensor to detect magnetic field intensities in two-axis directions.

In magnetization heat treatment (or pinning) for fixing magnetization directions of pin layers during manufacturing of magnetic sensors, substrates are each heated up to a prescribed temperature while a magnet away is positioned opposite to the surface of the substrate, wherein an intense magnetic field (whose value is 10 T or more, for example) is applied to the pin layer so as to allow two magnetic layers to be positioned in parallel with each other. Herein, the magnetic field applied to the pin layer occurs in a slit (e.g., a rectangular through-hole) of a yoke forming the magnet array, wherein the magnetization direction of the pin layer depends upon polarities of permanent magnets adjoining together in the magnet array. After heat treatment, the magnetic sensor is produced such that the magnetization directions of two magnetic layers are directed opposite to each other, in other words, two magnetic layers are placed in an anti-parallel state of magnetization.

Patent Document 2 teaches a small-size magnetic sensor in which planar surfaces and slopes (i.e., inclined surfaces inclined to planar surfaces) are formed on the surface of a single substrate, wherein giant magnetoresistive elements are formed on the planar surface and the slopes respectively, thus making it possible to detect magnetic field intensities in three-axial directions.

The slopes are formed by way of V-shaped channels formed on the surface of the substrate and are thus positioned opposite to each other in each channel. This magnetic sensor is formed using giant magnetoresistive elements, in which Ru layers are not inserted into magnetic layers of pin layers.

The magnetic sensor of Patent Document 2 is capable of detecting magnetic field intensities in three-axial directions, wherein magnetization directions of pin layers of giant magnetoresistive elements are affected and varied due to an excessively intense external magnetic field. When the external magnetic field becomes zero in intensity, magnetization directions are varied and fixed in wrong directions. That is, this magnetic sensor may suffer from a relatively weak resistance in ferromagnetism.

The giant magnetoresistive elements of synthetic antiferromagnetic structures used in the magnetic sensor of Patent Document 1 are each designed such that two magnetic layers forming a pin layer are placed in an anti-parallel state of magnetization, which may increase the resistance in ferromagnetism but which cannot detect magnetic field intensities in three-axial directions. For this reason, the inventor of this application modifies the magnetic sensor of Patent Document 2 such that giant magnetoresistive elements of synthetic antiferromagnetic structures are formed on planar surfaces and slopes of a substrate.

Suppose that three giant magnetoresistive elements having pin layers of different magnetization directions are formed on a planar surface and two slopes (i.e., paired slopes positioned opposite to each other via a channel) respectively. In magnetization heat treatment for fixing magnetization directions of pin layers, the overall area projecting the paired slopes having giant magnetoresistive elements whose pin layers are placed under a magnetic field becomes larger than the other area projecting the planar surface having a giant magnetoresistive element whose pin layer is also placed under the magnetic field. Herein, the width dimensions of giant magnetoresistive elements formed on the opposite slopes become larger than the width dimensions of a giant magnetoresistive element formed on the planar surface.

As described above, even when giant magnetoresistive elements of synthetic antiferromagnetic structures are applied to the magnetic sensor of Patent Document 2, it is necessary to apply an intense magnetic field whose value is 10 T or more to pin layers of giant magnetoresistive elements during heat treatment; hence, it is necessary to use a magnet array having slits. Herein, the width dimensions of a slit for applying a magnetic field to giant magnetoresistive elements formed on slopes are increased by differences of width dimensions between the slopes and the planar surface in comparison with the width dimensions of another slit for applying a magnetic field to a giant magnetoresistive element formed on the planar surface.

This may weaken the magnetic field applied to giant magnetoresistive elements formed on the slopes; hence, it becomes very difficult to apply an intense magnetic field to all the giant magnetoresistive elements during heat treatment. When a magnetic field having an inadequate intensity is applied to giant magnetoresistive elements in heat treatment, it becomes very difficult to place two magnetic layers in an anti-parallel state of magnetization after heat treatment.

In heat treatment in which an intense magnetic field is applied to giant magnetoresistive elements, variations of the intensity of the magnetic field applied to giant magnetoresistive elements become very large relative to variations of the distance between the substrate and the magnet array, which are positioned opposite to each other with a prescribed gap therebetween. That is, it is necessary to adjust the relative positioning and the distance between the substrate and the magnet array with very high precision. This may cause trouble in the manufacturing of magnetic sensors.

SUMMARY OF THE INVENTION

It is an object of the present invention to provide a magnetic sensor including a plurality of giant magnetoresistive elements in which magnetization directions of pin layers can be easily controlled in heat treatment.

It is another object of the present invention to provide a manufacturing method of the magnetic sensor.

In a first aspect of the present invention, a manufacturing method of a magnetic sensor includes a GMR component forming step and a magnetization heat treatment step. In the GMR component forming step, a plurality of GMR components each including a plurality of giant magnetoresistive elements are formed on the surface of a substrate, wherein each giant magnetoresistive element includes a free layer, a conductive layer, and a pin layer that are sequentially laminated together on the substrate, and wherein the pin layer includes a first magnetic layer, an Ru layer, a second magnetic layer, and an antiferromagnetic layer that are sequentially laminated together on the conductive layer. In the magnetization heat treatment, magnetization heat treatment is performed on the substrate arranging the GMR components, wherein a magnetic field is applied to the pin layer so as to fix its magnetization direction, and wherein the first and second magnetic layers are magnetized while maintaining the magnetization directions thereof in an anti-parallel state of magnetization.

In a second aspect of the present invention, a magnetic sensor is produced using a substrate and a plurality of GMR components each including a plurality of giant magnetoresistive elements, wherein each giant magnetoresistive element includes a free layer, a conductive layer, and a pin layer sequentially laminated on the surface of the substrate. Herein, the pin layer includes a first magnetic layer, an Ru layer, a second magnetic layer, and an antiferromagnetic layer, which are sequentially laminated together on the conductive layer, and the first and second magnetic layers differ from each other in magnetic moment thereof.

In the above, the first and second magnetic layers differ from each other in thickness and magnetic moment thereof. Herein, the thickness of the first magnetic layer is larger than the thickness of the second magnetic layer, and the thickness of the Ru layer ranges from 4 Å to 10 Å. In the magnetization heat treatment, a magnet array producing the magnetic field is positioned in proximity to the backside of the substrate whose surface arranges the GMR components.

A planar surface and at least one slope are formed on the substrate in advance. The GMR components having sensitivities in different axial directions are formed on the substrate in such a way that one GMR component is formed using the planar surface, and the other GMR component is formed using the slope. By arranging two GMR components using the planar surface and the slope of the substrate, it is possible to detect magnetism in two-axial directions. By arranging three GMR components using the planar surface and the slopes of the substrate, it is possible to detect magnetism in three-axial directions.

As described above, the present invention provides the following effects.

(1) In the magnetization heat treatment, it is necessary to apply a magnetic field having a relatively low intensity that allows the first and second magnetic layers to be magnetized in an anti-parallel state. Since the first and second magnetic layers differ from each other in magnetic moment thereof, they are magnetized in opposite directions due to the antiferromagnetic connection therebetween under the magnetic field.

(2) In the magnetization heat treatment, it is possible to fix desired magnetization directions and desired magnetization intensities to the first and second magnetic layers. This eliminates the necessity of applying a relatively high magnetic field to magnetic layers by use of yokes in order to maintain a parallel state of magnetization therebetween in the conventionally-known technology. In other words, the present invention simply requires a relatively low magnetic field applied to the magnetic layers in the magnetization heat treatment. This reduces variations of the magnetic field relative to variations of the distance between the magnet array and the substance; hence, it is unnecessary to precisely adjust the positioning and distance with respect to the magnet array and the substrate at a high precision. Thus, it is possible to easily control the magnetization direction of the pin layer in the magnetization heat treatment.

(3) Even when GMR components are formed using the planar surface and slopes of the substrate, it is possible to fix desired magnetization directions to the magnetic layers of the pin layers thereof without applying a relatively high magnetic field thereto. That is, it is possible to easily produce magnetic sensors that are capable of detecting magnetism in two-axial directions and in three-axial directions.

(4) Since the first and second magnetic layers have different thicknesses, it is possible for the first and second magnetic layers to reliably produce different magnetic moments. This makes it possible to fix desired magnetization directions to the first and second magnetic layers while maintaining the anti-parallel state of magnetization therebetween in the magnetization heat treatment.

(5) when the thickness of the first magnetic layer is larger than the thickness of the second magnetic layer, the magnetic moment of the first magnetic layer becomes higher than the magnetic moment of the second magnetic layer. In this case, the first magnetic layer is magnetized in the same direction as the magnetic field, while the second magnetic layer is magnetized in the direction opposite to the direction of the magnetic field.

(6) Magnetic forces of the first and second magnetic layers are exerted on the free layer, wherein they include the exchange coupling force of the first magnetic layers and the magnetostatic forces of the first and second magnetic layers. By increasing the magnetic moment of the first magnetic layer to be higher than the magnetic moment of the second magnetic layer, it is possible to easily reduce the sum of the exchange coupling force and magnetostatic forces exerted on the free layer.

(7) By appropriately adjusting, the thickness of the conductive layer, the exchange coupling force may substantially match the magnetostatic force of the first magnetic layer exerted on the free layer. Since the magnetic moment of the second magnetic layer is lower than the magnetic moment of the first magnetic layer, it is possible to reduce the magnetostatic force of the second magnetic layer exerted on the free layer to be smaller than the exchange coupling force and magnetostatic force of the first magnetic layer.

(8) Since the direction of the exchange coupling force is opposite to the direction of the magnetostatic force in the first magnetic layer but is identical to the magnetostatic force of the second magnetic layer, it is possible to easily reduce the sum of the exchange coupling force and the magnetostatic forces exerted on the free layer. In other words, it is possible to reduce the influence of the magnetization of the first and second magnetic layers with respect to the magnetization direction of the free layer; therefore, it is possible to set a desired magnetization direction to the free layer.

(9) By reducing the thickness of the Ru layer (which ranges from 4 Å to 10 Å), it is possible to easily maintain the anti-parallel state of magnetization between the first and second magnetic layers even when the magnetic field used in the magnetization heat treatment is increased. This increases the range of the intensity of the magnetic field maintaining the anti-parallel state of magnetization between the first and second magnetic layers, making it possible to easily control the intensity of the magnetic field in the magnetization heat treatment; hence, it is possible to easily control the magnetization direction of the pin layer.

(10) Since the magnet array is positioned in proximity to the backside of the substrate whose surface arranges the GMR components in the magnetization heat treatment of manufacturing of a magnetic sensor, even when a relatively high magnetic field occurs in proximity to the magnet array, it is possible to weaken the intensity of the magnetic field reaching the first and second magnetic layers of the pin layer because the magnet array is distanced from the GMR component by the thickness of the substrate, wherein it is possible to reduce variations of the intensity of the magnetic field relative to variations of the distance between the magnet array and the GMR component; hence, it is possible to easily adjust the intensity of the magnetic field applied to the GMR component.

(11) As described above, the present invention is designed to easily control the magnetization direction of the pin layer without applying a high magnetic field collapsing the anti-parallel state of magnetization between the first and second magnetic fields in the magnetization heat treatment; thus, it is possible to easily produce magnetic sensors that are capable of detecting magnetism in two-axial directions and in three-axial directions.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENT

The present invention will be described in further detail by way of examples with reference to the accompanying drawings.

A three-axial magnetic sensor 10 will be described in accordance with a preferred embodiment of the present invention with reference to FIGS. 1A, 1B, 2A, 2B, 3A, 3B, 4A, 4B, 4C, 5A, 5B, and 5C.

Figure 1A:
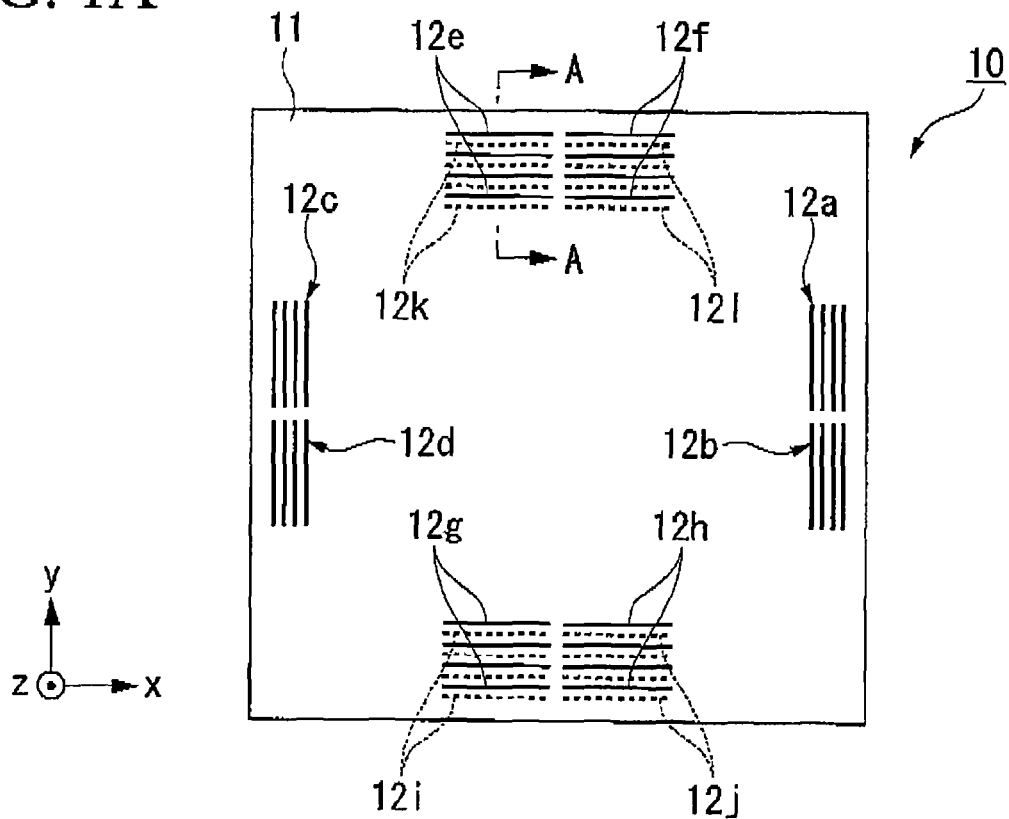
FIG. 1A is a plan view showing the constitution of a three-axial magnetic sensor in accordance with a preferred embodiment of the present invention.

As shown in FIG. 1A, the three-axial magnetic sensor 10 has a square shape in plan view having two sides lying in an X-axis and another two sides lying in a Y-axis and includes a substrate 11, which is composed of quartz or silicon and which has a small thickness in a Z-axis perpendicular to the X-axis and the Y-axis. In total, twelve sets of giant magnetoresistive elements are formed and positioned at prescribed positions on the surface of the substrate 11. Specifically, four X-axis GMR components (denoted as first, second, third, and fourth X-axis GMR components) 12a to 12d each including four giant magnetoresistive elements are formed at prescribed positions on the surface of the substrate 11 along the Y-axis; four Y1-axis GMR components (denoted as first, second, third, and fourth Y1-axis GMR components) 12e to 12h each including four giant magnetoresistive elements (designated by solid line segments representing GMR bars) are formed at prescribed positions on the surface of the substrate 11 along the X-axis; and four Y2-axis GMR components (denoted as first, second, third, and fourth Y2-axis GMR components) 12i to 12l each including four giant magnetoresistive elements (designated by dotted line segments representing GMR bars) are formed at prescribed positions on the surface of the substrate 11 along the X-axis. In addition, pads (i.e., parts for exacting output signals from wires to an external device, not shown), vias (i.e., portions for establishing connections between giant magnetoresistive elements and wires, not shown), which are not exposed in the final stage of manufacturing, and wires (not shown) are fabricated into the substrate 11. In addition, LSI components with wiring layers or wiring layers can be further fabricated into the substrate 11. When the LSI components with wiring layers are incorporated into the substrate 11, the three-axial magnetic sensor 10 can serve as a digital magnetic sensor for outputting digital signals. When only the wiring layers are incorporated into the substrate 11, the three-axial magnetic sensor 10 serves as an analog magnetic sensor for outputting analog signals.

In FIG. 1A, the left end along the X-axis is designated as a reference point of the X-axis, wherein a rightward direction from the reference point is denoted as a positive X-axis direction, and a leftward direction from the right end opposite to the reference point is denoted as a negative X-axis direction. Similarly, the lower end along the Y-axis is designated as a reference point of the Y-axis, wherein an upward direction from the reference point is denoted as a positive Y-axis direction, and a downward direction from the upper end opposite to the reference point is denoted as a negative Y-axis direction.

In the above, the first X-axis GMR component 12a and the second X-axis GMR component 12b, which adjoin together along the Y-axis, are positioned substantially in the center portion of the Y-axis in proximity to the right end of the X-axis. The third X-axis GMR component 12c and the fourth X-axis GMR component 12d, which adjoin together along the Y-axis, are positioned substantially in the center portion of the Y-axis in proximity to the left end of the X-axis.

The first Y1-axis GMR component 12e and the second Y1-axis GMR component 12f, which adjoin together along the X-axis, are positioned substantially in the center portion of the X-axis in proximity to the upper end of the Y-axis. The third Y1-axis GMR component 12g and the fourth Y1-axis GMR component 12h, which adjoin together along the X-axis, are positioned substantially in the center portion of the X-axis in proximity to the lower end of the Y-axis.

The first Y2-axis GMR component 12i and the second Y2-axis GMR component 12j, which adjoin together along the X-axis, are positioned substantially in the center portion of the X-axis in proximity to the lower end of the Y-axis. The third Y2-axis GMR component 12k and the fourth Y2-axis GMR component 12l, which adjoin together along the X-axis, are positioned substantially in the center portion of the X-axis in proximity to the upper end of the Y-axis.

Figure 2A:
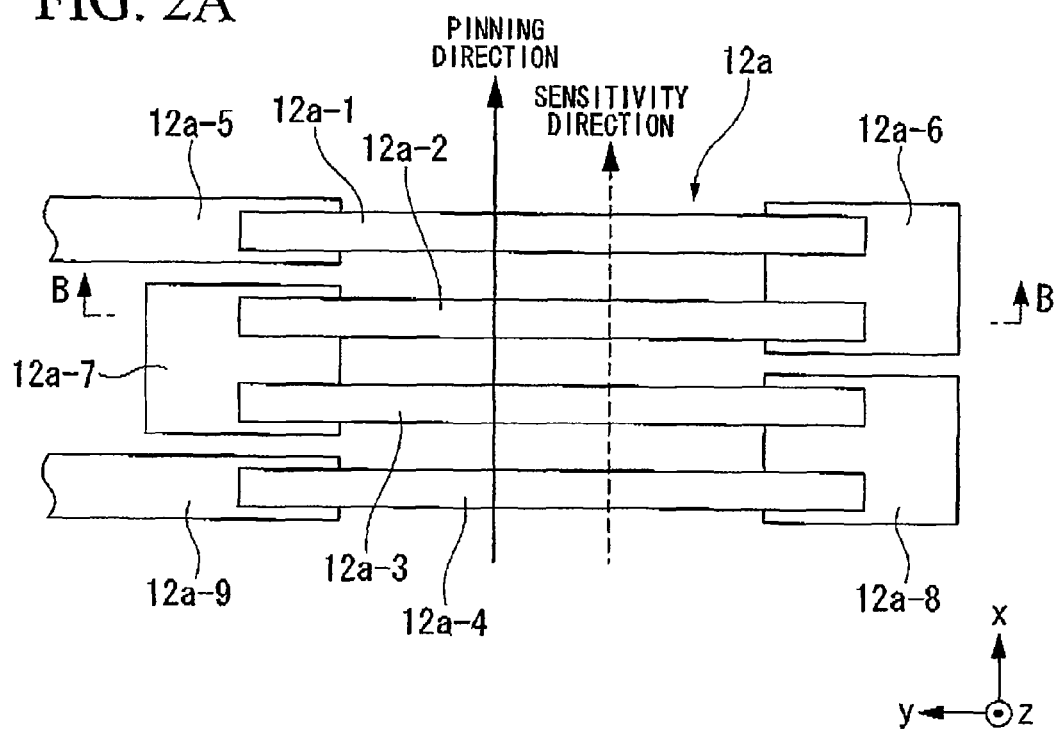
FIG. 2A is an illustration diagrammatically showing a GMR component including four GMR bars connected in series within the three-axial magnetic sensor shown in FIG. 1A.

Each of the twelve GMR components 12a-12d, 12e-12h, and 12i-12l includes a plurality of GMR bars (i.e., elongated band-shaped giant magnetoresistive elements), which are positioned in parallel. Specifically, FIG. 1A shows that each GMR component is constituted of four GMR bars, which is not a restriction, wherein it is preferable that each of the X-axis GMR components 12a to 12d include an even number of GMR bars. GMR bars are connected in series via lead films. At ends of connected GMR bars, lead films serving as terminals are formed. FIG. 2A shows an example of the constitution of the first X-axis GMR component 12a, which is similarly applied to the other X-axis GMR components 12b to 12d. Herein, four GMR bars (or giant magnetoresistive elements) 12a-1, 12a-2, 12a-3, and 12a-4 are connected in series via three lead films 12a-6, 12a-7 and 12a-8. In addition, a lead film 12a-5 serving as a terminal is connected to one terminal end of the series connection of the GMR bars 12a-1 to 12a-4, and another lead film 12a-9 serving as a terminal is connected to the other terminal end of the series connection of the GMR bars 12a-l to 12a-4. The GMR bars (e.g., the GMR bars 12a-1 to 12a-4) included in the X-axis GMR components 12a to 12d are formed on the planar surfaces, which are parallel to the overall surface of the substrate 11, wherein the longitudinal directions thereof are each parallel to the Y-axis, in other words, they are each perpendicular to the X-axis.

A plurality of projections (or banks) 15 each having a trapezoidal shape in its cross section are formed on the substrate 11, wherein each projection 15 has two slopes, namely, a first slope 15a and a second slope 15b. Each of the Y1-axis GMR components 12e to 12h and the Y2-axis GMR components 12i to 12l includes a prescribed number of GMR bars, which are formed on slopes of projections of the substrate 11.

Figure 1B:
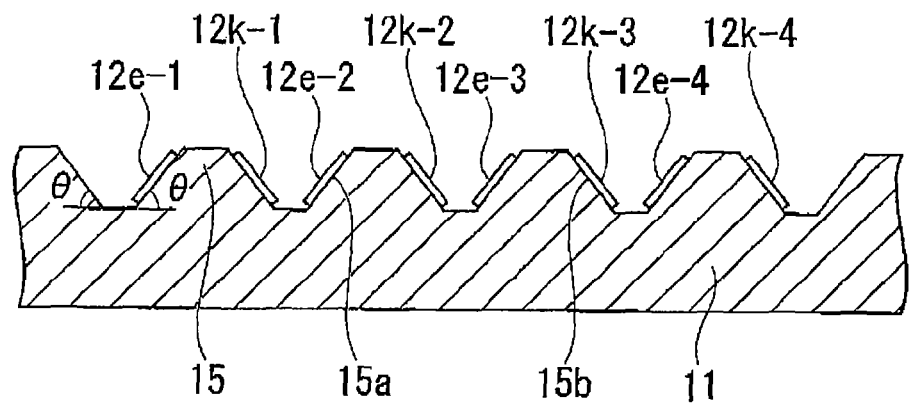
FIG. 1B is a cross-sectional view taken along line A-A in FIG. 1A.

The arrangements of the first Y1-axis GMR component 12e (including GMR bars 12e-1, 12e-2, 12e-3, and 12e4) and the third Y2-axis GMR component 12k (including GMR bars 12k-1, 12k-2, 12k-3, and 12k-4), which are coupled together in a prescribed section of the substrate 11 (see FIG. 1A), will be described with reference to FIG. 1B and FIG. 4B. The GMR bars 12e-1 to 12e-4 of the first Y1-axis GMR component 12e are formed on the first slopes 15a of the projections 15, while the GMR bars 12k-1 to 12k-4 of the third Y2-axis GMR component 12k are formed on the second slopes 15b of the projections 15. The longitudinal directions of the GMR bars 12e-l to 12e-4 and the GMR bars 12k-1 to 12k-4 run in parallel with the ridgelines of the projections 15. Both the slopes 15a and 15b are inclined with the same inclination angle θ (where 20°≦θ≦60°) relative to the planar surfaces of the substrate 11.

One GMR bar of the Y1-axis GMR component 12e is positioned opposite to the corresponding GOU bar of the Y2-axis GMR component 12k with respect to a single projection 15. For example, the GMR bar 12e-1 and the GMR bar 12k-1 are formed on the slopes 15a and 15b of one projection 15, while the GMR 12e-2 and the GMR bar 12k-2 are formed on the slopes 15a and 15b of another projection 15. The longitudinal directions of the (my bars of the Y1-axis GMR components 12e to 12h and the GMR bars of the Y2-axis GMR components 12i to 12l run in parallel with the X-axis, in other words, they run perpendicular to the Y-axis.

The constitution of the GMR bar will be described with respect to the GMR bar 12a-2 of the first X-axis GMR component 12a, for example, with reference to FIG. 2B and FIGS. 3A and 3B. The same constitution is applied to the other GMR bars 12a-1, 12a-3, and 12a-4, the descriptions of which are thus omitted. In addition, the same constitution is similarly applied to the other X-axis GOU components 12b to 12d, the Y1-axis GMR components 12e to 12h, and the Y2-axis GMR components 12i to 12l, the descriptions of which are thus omitted.

Figure 2B:
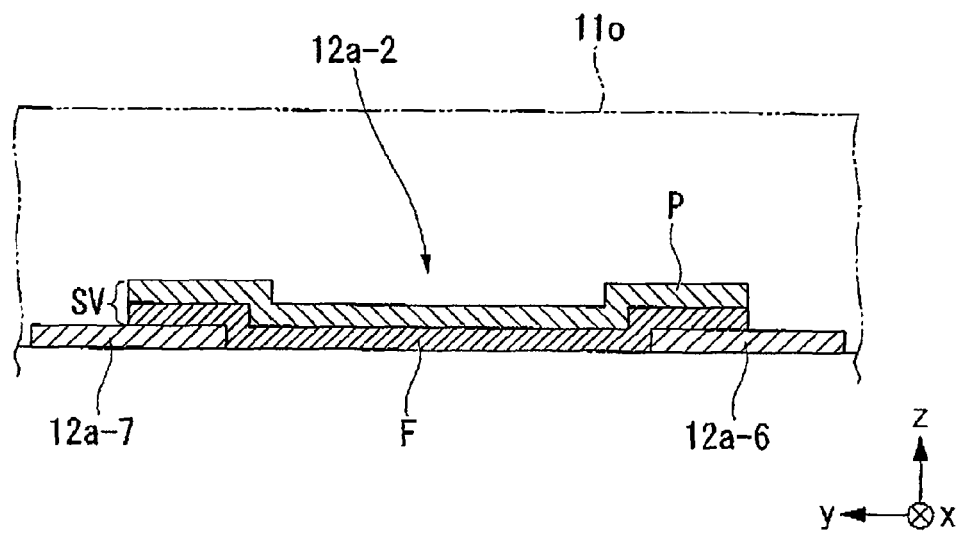
FIG. 2B is a cross-sectional view taken along line B-B in FIG. 2A with respect to the GMR bar.

As shown in FIG. 2B, the GMR bar 12a-2 of the first X-axis GMR component 12a includes a spin-valve film SV whose longitudinal direction lies perpendicular to the X-axis (or in parallel with the Y-axis). Both ends of the spin-valve film SV are connected to the lead films 12a-6 and 12a-7 formed therebelow. The lead films 12a-6 and 12a-7 are each formed using a non-magnetic metal film composed of chromium (Cr) and the like, wherein the thickness thereof is set to 130 nm (1300 Å), for example.

Figure 3A:
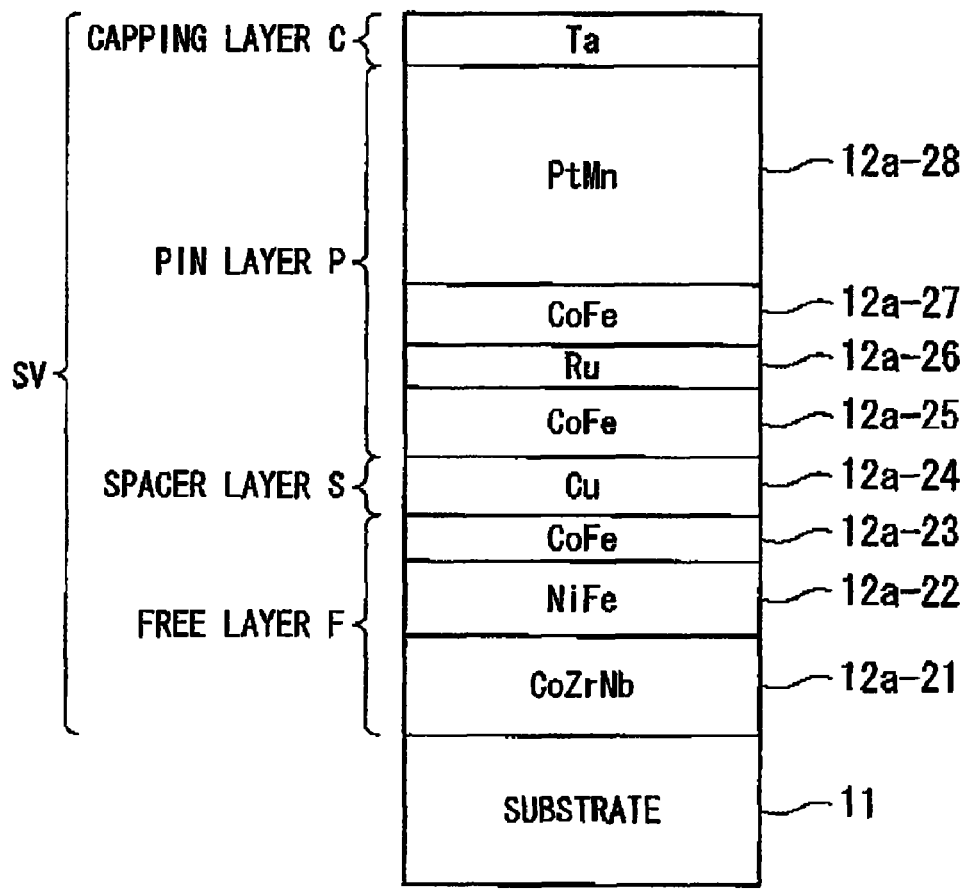
FIG. 3A diagrammatically shows the lamination of layers forming a spin-valve film included in the GMR bar shown in FIG. 2B.

As shown in FIG. 3A, the spin-valve film SV is constituted of a free layer (i.e., a free magnetization layer) F, a conductive spacer layer (i.e., a conductive layer) composed of copper (Cu) whose thickness is 2.8 nm (28 Å), a pin layer (i.e., a fixed layer or a fixed magnetization layer) P, and a capping layer C composed of tantalum (Ta) or titanium (Ti) whose thickness is 2.5 nm (25 Å). The free layer A, the spacer layer S, the pin layer P, and the capping layer C are sequentially laminated and formed on the substrate 11.

The magnetization direction of the free layer F varies in response to the direction of an external magnetic field. The free layer F is composed of a CoZrNb amorphous magnetic layer 12a-21 whose thickness is 8 nm (80 Å), a NiFe magnetic layer 12a-22 whose thickness is 3.3 nm (33 Å), and a CoFe layer 12a-23 whose thickness is 1.2 nm (12 Å). These layers are sequentially laminated together in such a way that the CoZrNb amorphous magnetic layer 12a-21 is formed just above the substrate 11; the NiFe magnetic layer 12a-22 is formed on the CoZrNb amorphous magnetic layer 12a-21; and the CoFe layer 12a-23 is formed on the NiFe magnetic layer 12a-22.

The CoZrNb amorphous magnetic layer 12a-21, the NiFe magnetic layer 12a-22, and the CoFe layer 12a-23 are laminated together to form a soft ferromagnetic thin film. The CoFe layer 12a-23 is provided to avoid the Ni diffusion of the NiFe layer 12a-22 and the Cu diffusion of a Cu layer 12a-24 forming the spacer layer S.

The pin layer P is constituted of a first CoFe magnetic layer 12a-25 whose thickness is 3.2 nm (32 Å), a Ru layer 12a-26 whose thickness is 0.5 nm (5 Å), a second CoFe magnetic layer 12a-27 whose thickness is 2.2 nm (22 Å), and an antiferromagnetic layer 12a-28 whose thickness is 24 nm (240 Å), which is composed of a PtMn alloy including Pt whose content ranges from 45 mol % to 55 mol %. These layers are sequentially laminated together in such a way that the first CoFe magnetic layer 12a-25 is formed on the Cu layer 12a-24; the Ru layer 12a-26 is formed on the first CoFe magnetic layer 12a-25; the second CoFe magnetic layer 12a-27 is formed on the Ru layer 12a-26; and the antiferromagnetic layer 12a-28 is formed on the second CoFe magnetic layer 12a-27.

The aforementioned values of thickness of the layers forming the free layer F and the pin layer P as well as the aforementioned values of thickness of the spacer layer S and the capping layer C are determined with respect to the X-axis GMR components 12a to 12d. With respect to the other GMR components such as the Y1-axis GMR components 12e to 12h and the Y2-axis GMR components 12i to 12l, the thickness of their layers are reduced in a range between 70% and 80% as the aforementioned values of thickness determined with respect to the X-axis GMR components 12a to 12d.

Figure 3B:
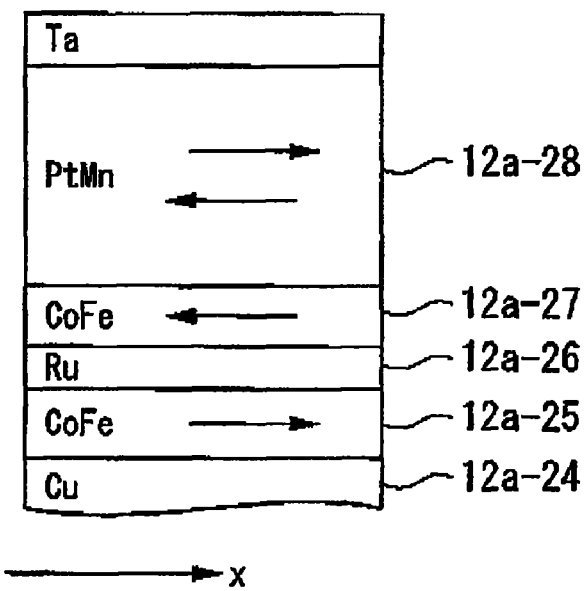
FIG. 3B diagrammatically shows magnetization directions of layers included in a pin layer of the spin-valve film shown in FIG. 3A.

As shown in FIG. 3B, the second CoFe magnetic layer 12a-27 is lined with the antiferromagnetic layer 12a-28 in a exchange coupling manner, wherein the magnetization direction (or magnetization vector) thereof is fixed (or pinned) in the negative X-axis direction. The first CoFe magnetic layer 12a-25 is connected to the second CoFe magnetic layer 12a-27 in an antiferromagnetic manner, wherein the magnetization direction thereof is fixed in the positive X-axis direction. That is, the magnetization direction of the pin layer P depends upon the magnetization directions of the CoFe magnetic layers 12a-25 and 12a-27.

Figure 4A:
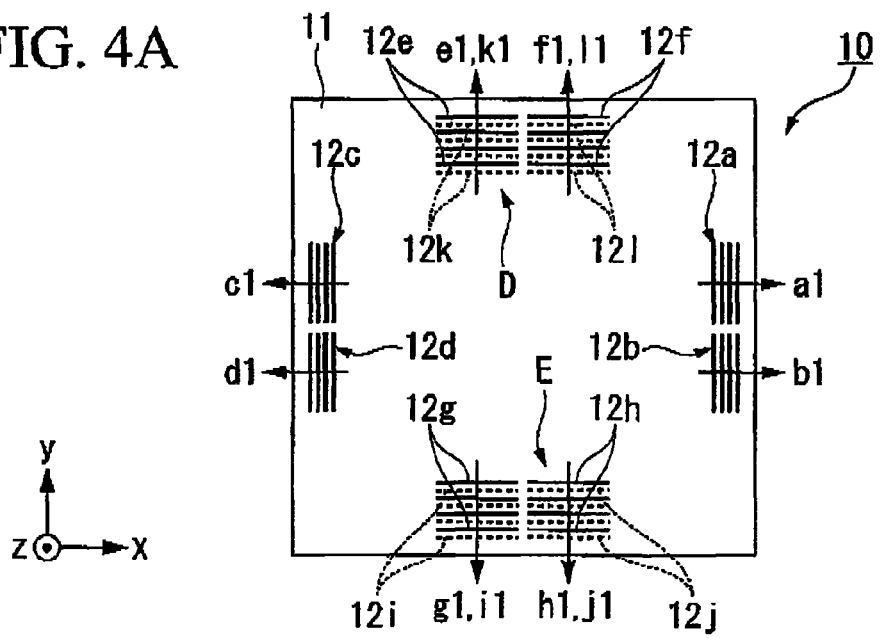
FIG. 4A is a plan view showing pinning directions and sensitivity directions of the three-axial magnetic sensor shown in FIG. 1A.

As shown in FIGS. 2A, 3B, and 4A, the sensitivity direction of the first X-axis GMR component 12a lies in parallel with the planar surface of the substrate 11 and perpendicular to the magnetization direction of the free layer F, in other words, it lies in a direction perpendicular to the longitudinal directions of the GMR bars and in the positive X-axis direction (see an arrow a1 shown in FIG. 4A). Similar to the first X-axis GMR component 12a, the sensitivity direction of the second X-axis GMR component 12b lies in the positive X-axis direction (see an arrow b1 shown in FIG. 4A).

When a magnetic field is applied to the three-axial magnetic sensor 10 in the directions a1 and b1, the resistance of the first X-axis GMR component 12a and the resistance of the second X-axis GMR component 12b are reduced in proportion to the intensity of the magnetic field. When a magnetic field is applied to the three-axial magnetic sensor 10 in the directions opposite to the directions a1 and b1, the resistance of the first X-axis GMR component 12a and the resistance of the second X-axis GMR component 12b are increased in proportion to the intensity of the magnetic field.

As shown in FIG. 4A, the sensitivity directions of the third X-axis GMR component 12c and the fourth X-axis GMR component 12d lie in the directions perpendicular to the longitudinal directions of the GMR bars and are thus reverse to the sensitivity directions of the first X-axis GEM component 12a and the second X-axis GMR component 12b by 180°. In the third X-axis GMR component 12c and the fourth X-axis GMR component 12d, the pin layers are formed in such a way that the magnetization directions (or magnetization vectors) thereof are fixed (or pinned) in the negative X-axis direction (see arrows c1 and d1 shown in FIG. 4A), which is reverse to the magnetization directions of the pin layers included in the GMR bars of the first X-axis GMR component 12a and the second X-axis GMR component 12b by 180°.

Therefore, when a magnetic field is applied to the three-axial magnetic sensor 10 in the directions c1 and d1, the resistances of the third X-axis GMR component 12c and the fourth X-axis GMR component 12d are reduced in proportion to the intensity of the magnetic field. When a magnetic field is applied in the directions opposite to the directions c1 and d1, the resistances of the third X-axis GMR component 12c and the fourth X-axis GMR component 12d are increased in proportion to the intensity of the magnetic field.

Figures 4B, 4C:
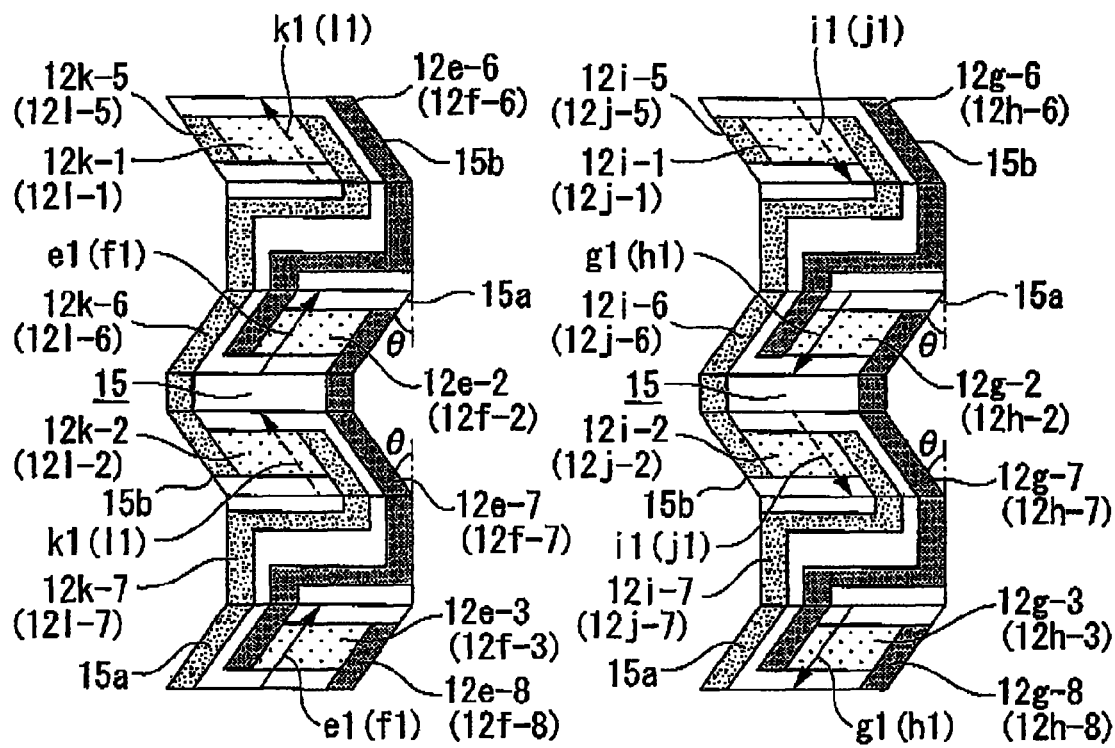
FIG. 4B is an enlarged perspective view showing a section D of the three-axial magnetic sensor shown in FIG. 4A, in which two GMR components each including four GMR bars are coupled together.
FIG. 4C is an enlarged perspective view showing a section E of the three-axial magnetic sensor shown in FIG. 4A, in which two GMR components each including four GMR bars are coupled together.

As shown in FIG. 4B, the sensitivity directions of the first Y1-axis GMR component 12e and the second Y1-axis GMR component 12f lie perpendicular to the longitudinal directions of their GMR bars (e.g., GMR bars 12e-2 and 12e-3 and GMR bars 12f-2 and 12f-3) along the tint slopes 15a (each having the inclination angle θ) of the projections 15 in the positive Y-axis direction and negative Z-axis direction; that is, they lie in directions e1 and f1 shown in FIGS. 4A and 4B.

When a magnetic field including magnetic components directed to the directions e1 and f1 is applied to the three-axis magnetic sensor 10 shown in FIG. 4A, the resistances of the first Y1-axis NMR component 12e and the second Y1-axis GMR component 12f are reduced in proportion to the intensity of the magnetic field. When a magnetic field including magnetic components lying in the directions opposite to the directions e1 and f1 is applied to the three-axial magnetic sensor 10, the resistances of the first Y1-axis GMR component 12e and the second Y1-axis GMR component 12f are increased in proportion to the intensity of the magnetic field.

As shown in FIG. 4C, the sensitivity directions of the third Y1-axis GMR component 12g and the fourth Y1-axis GMR component 12h lie perpendicular to the longitudinal directions of their GMR bars (e.g., GMR bars 12e-2 and 12e-3 and GMR bars 12h-2 and 12h-3) along the first slopes 15a of the projections 15 in the negative Y-axis direction and negative Z-axis direction; that is, they lie in directions g1 and h1 shown in FIGS. 4A and 4C. That is, the sensitivity directions of the third Y1-axis GMR component 12g and the fourth Y1-axis GMR component 12h are reverse to the sensitivity directions of the first Y1-axis GMR component 12e and the second Y1-axis GMR component 12f by 180°.

Therefore, when a magnetic field including magnetic components lying in the directions g1 and h1 is applied to the three-axial magnetic sensor 10 shown in FIG. 4A, the resistances of the third Y1-axis GMR component 12g and the fourth Y1-axis GMR component 12h are reduced in proportion to the intensity of the magnetic field. When a magnetic field including magnetic components lying in the directions opposite to the directions g1 and h1 is applied to the three-axial magnetic sensor 10, the resistances of the third Y1-axis GMR component 12g and the fourth Y1-axis GMR component 12h are increased in proportion to the intensity of the magnetic field.

As shown in FIG. 4C, the sensitivity directions of the first Y2-axis GMR component 12i and the second Y2-axis GMR component 12j lie perpendicular to the longitudinal directions of their GMR bars (e.g., GMR bars 12i-2 and 12i-3, and GMR bars 12j-2 and 12j-3) along the second slopes 15b (having the inclination angle θ) of the projections 15 in the negative Y-axis direction and positive Z-axis direction; that is, they lie in directions i1 and j1 shown in FIGS. 4A and 4C.

Therefore, when a magnetic field including magnetic components lying in the directions i1 and j1 is applied to the three-axial magnetic sensor 10 shown in FIG. 4A, the resistances of the first Y2-axis GMR component 12i and the second Y2-axis GMR component 12j are reduced in proportion to the intensity of the magnetic field. When a magnetic field including magnetic components lying in the directions opposite to the directions i1 and j1 is applied to the three-axial magnetic sensor 10, the resistances of the first Y2-axis GMR component 12i and the second Y2-axis GMR component 12j are increased in proportion to the intensity of the magnetic field.

As shown in FIG. 4B, the sensitivity directions of the third Y2-axis GMR component 12k and the fourth Y2-axis GMR component 12l lie perpendicular to the longitudinal directions of their GMR bars (e.g., GMR bars 12k-2 and 12k-3, and GMR bars 12l-2 and 12l-3) along the second slopes 15b of the projections 15 in the positive Y-axis direction and positive Z-axis direction; that is, they lie in directions k1 and l1 shown in FIGS. 4A and 4B.

Therefore, when a magnetic field including magnetic components lying in the directions k1 and l1 is applied to the three-axial magnetic sensor 10 shown in FIG. 4A, the resistances of the third Y2-axis GMR component 12k and the fourth Y2-axis GMR component 12l are reduced in proportion to the intensity of the magnetic field. When a magnetic field including magnetic components lying in the directions opposite to the directions k1 and l1 is applied to the three-axial magnetic sensor 10, the resistances of the third Y2-axis GMR component 12k and the fourth Y2-axis GMR component 12l are increased in proportion to the intensity of the magnetic field.

Figure 5A:
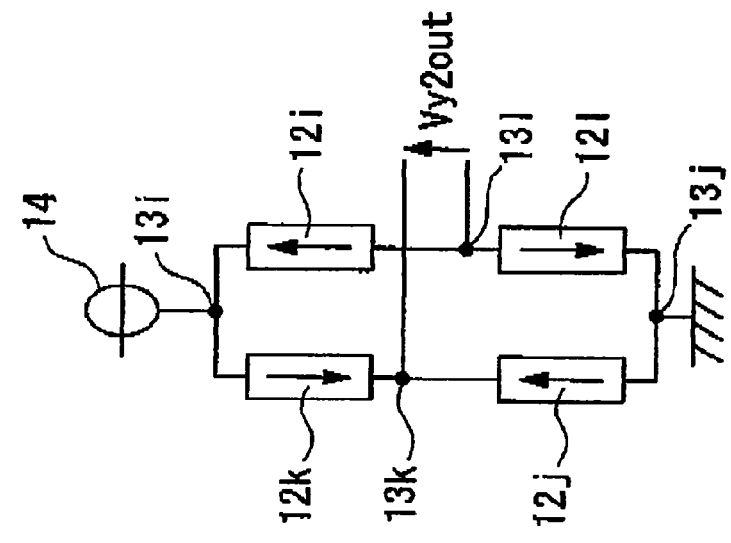
FIG. 5A shows an equivalent circuit including four X-axis GMR components in a full bridge connection.
Figure 5B:
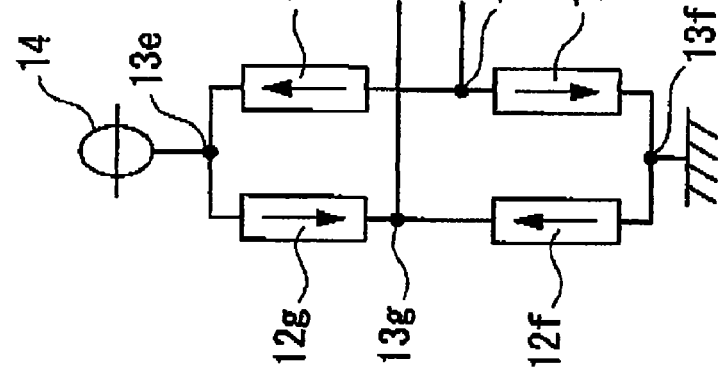
FIG. 5B shows an equivalent circuit including four Y1-axis GMR components in a full bridge connection.
Figure 5C:
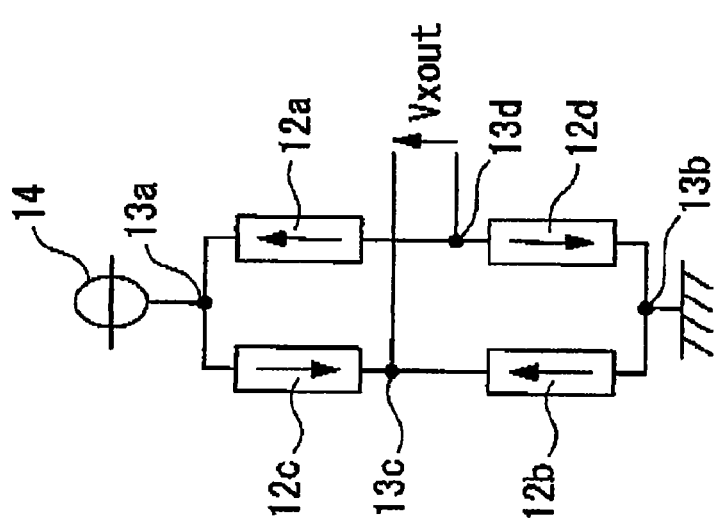
FIG. 5C shows an equivalent circuit including four Y2-axis GMR components in a full bridge connection.

FIGS. 5A to 5C show equivalent circuits with respect to the X-axis GMR components 12a to 12d, the Y1-axis GMR component 12e to 12h, and the Y2-axis GMR components 12i to 12l, the magnetization directions of which are designated by arrows, wherein upward arrows correspond to the GMR components whose pin layers P are each pinned in the negative Y-axis direction.

FIG. 5A shows an equivalent circuit in which the four X-axis GMR components 12a to 12d for detecting magnetic components lying in the directions a1, b1, c1, and d1 along the X-axis are connected in a fall bridge circuit. A pad 13a coupled to the X-axis GMR components 12a and 12c is connected to a positive electrode of a constant voltage source 14 and is thus applied with a potential Vxin$^+$ (e.g., 3V). A pad 13b coupled to the X-axis GMR components 12b and 12d is connected to a negative electrode of the constant current source 14 and is thus applied with a potential Vxin$^-$ (e.g., 0V). In addition, a potential Vxout$^+$ is extracted from a pad 13c coupled to the X-axis GMR components 12b and 12c, while a potential Vxout$^-$ is extracted from a pad 13d coupled to the X-axis GMR components 12a and 12d. Thus, it is possible to produce a sensor output Vxout corresponding to a potential difference (Vxout$^+$−Vxout$^-$).

FIG. 5B shows an equivalent circuit in which the four Y1-axis GMR components 12e to 12h for detecting magnetic components lying in the directions e1, f1, g1, and h1 along the Y-axis are connected in a full bridge circuit. A pad 13e coupled to the Y1-axis GMR components 12e and 12g is connected to the positive electrode of the constant voltage source 14 and is thus applied with a potential Vy1in$^+$ (e.g. 3V). A pad 13f coupled to the Y1-axis GM components 12f and 12h is connected to the negative electrode of the constant current source 14 and is thus applied with a potential Vy1in$^-$ (e.g., 0V). Thus, it is possible to produce a sensor output Vy1out corresponding to a potential difference between a pad 13g coupled to the Y1-axis GMR components 12f and 12g and a pad 13h coupled to the Y1-axis GMR components 12e and 12h.

FIG. 5C shows an equivalent circuit in which the four Y2-axis GMR components 12i to 12l for detecting magnetic components lying in the directions i1, j1, k1, and l1 along the Y-axis are connected in a full bridge circuit. A pad 13i coupled to the Y2-axis GMR components 12i and 12k is connected to the positive electrode of the constant voltage source 14 and is thus applied with a potential Vy2in$^+$ (e.g., 3V). A pad 13j coupled to the Y2-axis GMR components 12j and 12l is connected to the negative electrode of the constant current source 14 and is thus applied with a potential Vy2in$^-$ (e.g., 0V). Thus, it is possible to produce a sensor output Vy2out corresponding to a potential difference between a pad 13k coupled to the Y2-axis GMR components 12j and 12k and a pad 13l coupled to the Y2-axis GMR components 12i and 12l.

Based on the sensor outputs Vxout, Vy1out, and Vy2out, it is possible to calculate three magnetic components of a magnetic field applied to the three-axial magnetic sensor 10, i.e., an X-axis magnetic component Hx, a Y-axis magnetic component Hy, and a Z-axis magnetic component Hz in accordance with equations (1), (2), and (3). Calculations are implemented by an LSI component formed in the substrate 11 in advance or an individual LSI chip electrically connected to the three-axial magnetic sensor 10.

$$Hx = 2kx \times Vxout \quad (1)$$

$$Hy = \frac{ky(Vy1out - Vy2out)}{\cos\theta} \quad (2)$$

$$Hz = \frac{kz(Vy1out + Vy2out)}{\sin\theta} \quad (3)$$

In the above, θ denotes the inclination angle of the slopes 15a and 15b of the projection 15, where 20°≦θ≦60°; and kx, ky, and kz denote proportional constants, wherein kx=ky=kz when the same sensitivity is achieved by all the GMR components 12a to 12l.

Next, a manufacturing method of the three-axial magnetic sensor 10 having the aforementioned constitution will be described in detail with reference to FIGS. 6A-6C, FIGS. 7A-7C, FIGS. 8A-8C, FIGS. 9A-9C, FIGS. 10A-10C, FIGS. 11A-11C, FIGS. 12A-12C, FIGS. 13A-13C, FIGS. 14A-14C, and FIGS. 15A-15C, wherein "A" appended to each figure number indicates an illustration of a via, "B" appended to each figure number indicates an illustration of a pad, and "C" appended to each figure number indicates a Y1-axis or Y2-axis GMR component. As the substrate 11, it is preferable to use a substrate fabricated with an LSI component or a substrate fabricated with only a wiring layer in advance by way of CMOS manufacturing processes.

Figure 6A:
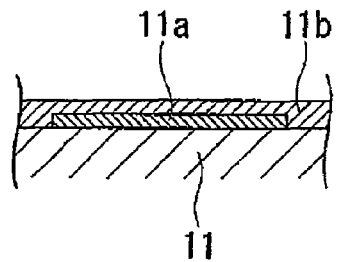
FIG. 6A is a cross-sectional view of a via formed in a first step of a manufacturing method adapted to the three-axial magnetic sensor.
Figure 6B:
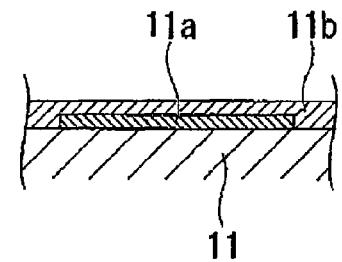
FIG. 6B is a cross-sectional view of a pad formed in the first step of the manufacturing method adapted to the three-axial magnetic sensor.
Figure 6C:
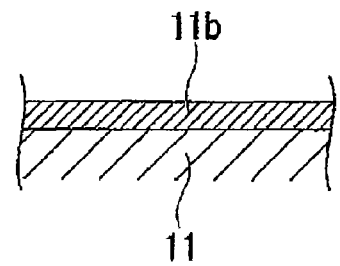
FIG. 6C is a cross-sectional view of a Y1-axis or Y2-axis GMR component formed in the first step of the manufacturing method adapted to the three-axial magnetic sensor.

In a first step of the manufacturing method of the three-axial magnetic sensor 10 as shown in FIGS. 6A to 6C, an interlayer insulating film 11b, e.g., a SOG (Spin On Glass) film 11b, is applied to the substrate 11 (e.g., a quartz substrate or a silicon substrate), in which a wiring layer 11a is formed in advance, thus forming a planar surface on the substrate 11.

Figure 7A:
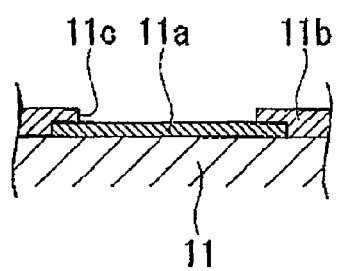
FIG. 7A is a cross-sectional view of the via formed in a second step of the manufacturing method adapted to the three-axial magnetic sensor.
Figure 7B:
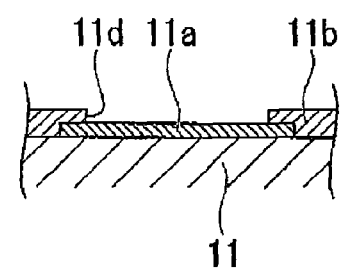
FIG. 7B is a cross-sectional view of the pad formed in the second step of the manufacturing method adapted to the three-axial magnetic sensor.
Figure 7C:
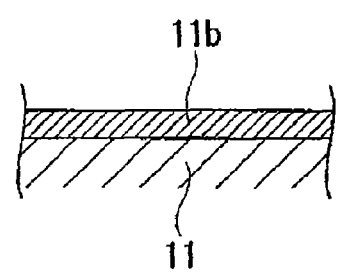
FIG. 7C is a cross-sectional view of the Y1-axis or Y2-axis GMR component, formed in the second step of the manufacturing method adapted to the three-axial magnetic sensor.

In a second step of the manufacturing method as shown in FIGS. 7A to 7C, a prescribed portion of the interlayer insulating film 11b is removed via etching so as to form an opening 11c (see FIG. 7A), thus exposing the wiring layer 11a in the via; and a prescribed portion of the interlayer insulating film 11b is removed via etching so as to form an opening 11d (see FIG. 7B), thus exposing the wiring layer 11a in the pad.

Figure 8A:
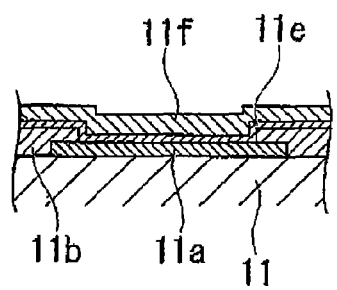
FIG. 8A is a cross-sectional view of the via formed in a third step of the manufacturing method adapted to the three-axial magnetic sensor.
Figure 8B:
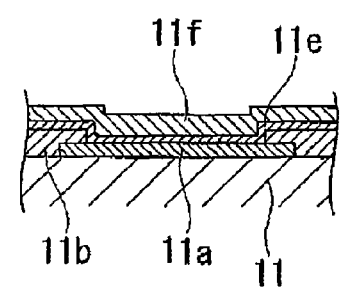
FIG. 8B is a cross-sectional view of the pad formed in the third step of the manufacturing method adapted to the three-axial magnetic sensor.
Figure 8C:
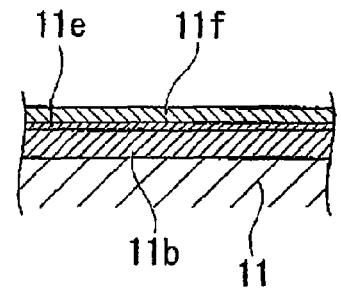
FIG. 8C is a cross-sectional view of the Y1-axis or Y2-axis GMR component formed in the third step of the manufacturing method adapted to the three-axial magnetic sensor.

In a third step of the manufacturing method as shown in FIGS. 8A to 8C, an oxide film 11e composed of SiO$_2$ (or SiOx) having a 1500 Å thickness and a nitride film 11f composed of Si$_3$N$_4$ (or SiNx) having a 5000 Å thickness are sequentially formed via plasma CVD (Chemical Vapor Deposition); a resist is fiercer applied thereon; then, cutting is performed to form a prescribed pattern having openings in the via and pad.

Figure 9A:
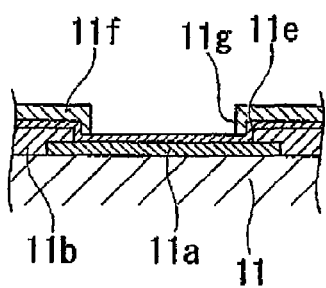
FIG. 9A is a cross-sectional view of the via formed in a fourth step of the manufacturing method adapted to the three-axial magnetic sensor.
Figure 9B:
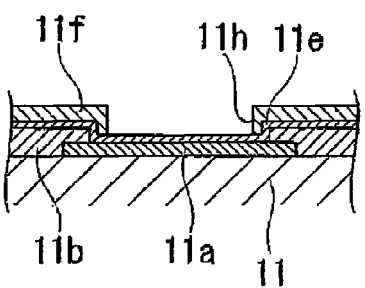
FIG. 9B is a cross-sectional view of the pad formed in the fourth step of the manufacturing method adapted to the three-axial magnetic sensor.
Figure 9C:
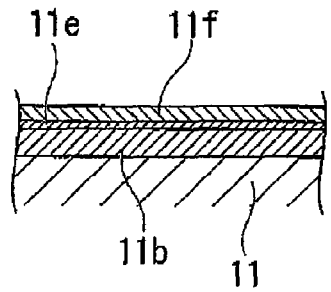
FIG. 9C is a cross-sectional view of the Y1-axis or Y2-axis GMR component formed in the fourth step of the manufacturing method adapted to the three-axial magnetic sensor.

In a fourth step of the manufacturing method as shown in FIGS. 9A to 9C, the nitride film 11f is partially removed from the via and the pad, whereby an opening 11g (see FIG. 9A) is formed so as to expose the oxide film 11e in the via, and an opening 11h (see FIG. 9B) is formed so as to expose the oxide film 11e in the pad. The openings 11g and 11h are formed in such a way that the oxide film 11e is not completely etched and still remains. The diameters of the opening 11g and 11h are smaller than the diameters of the openings 11c and 11d so as to prevent the interlayer insulating film 11b from being exposed in the openings 11c and 11d and to thereby prevent water content from entering into the wiring layer 11a and the LSI component (not shown).

In fifth and sixth steps of the manufacturing method as shown in FIGS. 10A to 10C and FIGS. 11A to 11C, a planar surface elongated perpendicular to the thickness direction of the substrate 11 is formed, and slopes (i.e., the first slope 15a and the second slope 15b, see FIG. 1B and FIGS. 4B and 4C) inclined relative to the planar surface are formed on the surface of the substrate. These steps will be collectively referred to as a mount surface forming step.

Figure 10A:
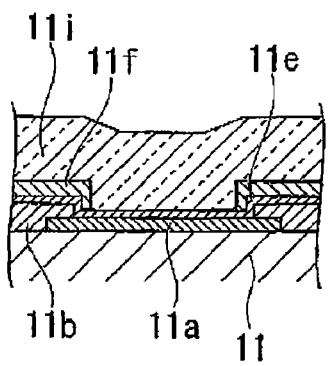
FIG. 10A is a cross-sectional view of the via formed in a fifth step of the manufacturing method adapted to the three-axial magnetic sensor.
Figure 10B:
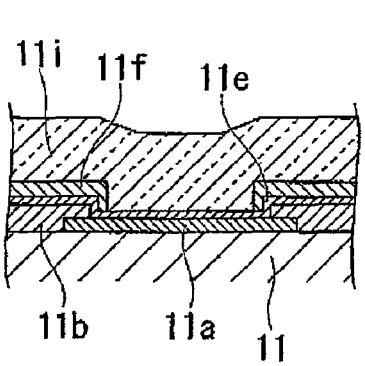
FIG. 10B is a cross-sectional view of the pad formed in the fifth step of the manufacturing method adapted to the three-axial magnetic sensor.
Figure 10C:
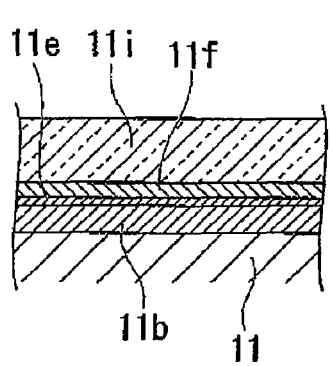
FIG. 10C is a cross-sectional view of the Y1-axis or Y2-axis GMR component formed in the fifth step of the manufacturing method adapted to the three-axial magnetic sensor.

In the fifth step of the manufacturing method as shown in FIGS. 10A to 10C (which will be referred to as a resist forming step), an upper oxide film 11j (serving as a base film) is formed on the surface of the substrate 11; then, a resist film 11j having a trapezoidal projection having slopes is formed on the upper oxide film 11i. Specifically, the upper oxide film 11i composed of $SiO_2$ (or $SiOx$) and having a 5 μm thickness is formed on the oxide film 11e and the nitride film 11f via plasma CVD. Then, a resist is applied to the upper oxide film 11i via a spin-coat method or a dip-coat method so as to form the resist film 11j having a 5 μm thickness. In this state, the surface of the resist film 11j is a planar surface elongated perpendicular to the thickness direction of the substrate 11.

The resist film 11j is subjected to cutting so as to form a prescribed pattern forming the openings of the via and pad in connection with the upper oxide film 11i and to form another pattern forming the slopes in the upper oxide film 11i, in other words, another pattern forming the projections for arranging the Y1-axis GMR component and the Y2-axis GMR component.

Figure 11A:
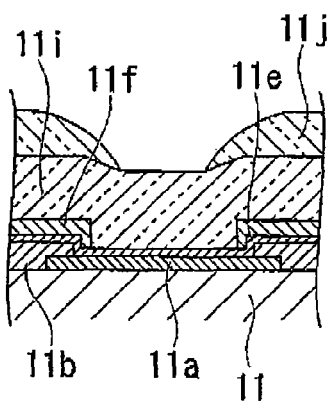
FIG. 11A is a cross-sectional view of the via formed in a sixth step of the manufacturing method adapted to the three-axial magnetic sensor.
Figure 11B:
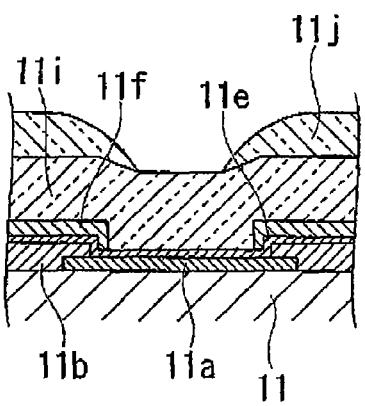
FIG. 11B is a cross-sectional view of the pad formed in the sixth step of the manufacturing method adapted to the three-axial magnetic sensor.
Figure 11C:
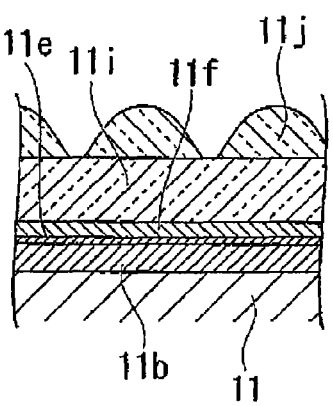
FIG. 11C is a cross-sectional view of the Y1-axis or Y2-axis GMR component formed in the sixth step of the manufacturing method adapted to the three-axial magnetic sensor.

After completion of cutting, the substrate 11 is subjected to heat treatment at a temperature of 150° C. for a prescribed time ranging from one minute to ten minutes so as to soften the resist film 11f, which is thus formed in a tapered shape as shown in FIGS. 11A and 11B. Thus, it is possible to form projections having slopes for mounting the Y1-axis GMR component and the Y2-axis GMR component. FIGS. 11A to 11C do not precisely show that the surface of the resist film 11j for mounting the X-axis GMR component is still maintained in the original planar surface thereof.

In the mount surface forming step, after completion of the resist forming step, the upper oxide film 11i and the resist film 11j are subjected to anisotropic etching so as to form slopes in the upper oxide film 11i in conformity with the resist film 11j forming the projection. This will be referred to as an anisotropic etching step. Specifically, both the upper oxide film 11i and the resist film 11j are subjected to dry etching at substantially the same etching rate such that, after completion of dry etching, the remaining portion of the upper oxide film 11i has a maximum thickness of approximately 0.5 μm (approximately 5000 Å). In addition, dry etching is performed in such a way that the diameters of the openings formed in the upper oxide film 11i do not become larger than the diameters of the openings formed in the nitride film 11f in connection with the via and pad.

Figure 12A:
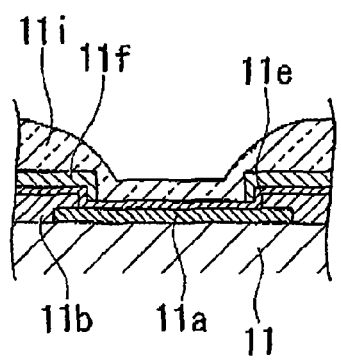
FIG. 12A is a cross-sectional view of the via formed in a seventh step of the manufacturing method adapted to the three-axial magnetic sensor.
Figure 12B:
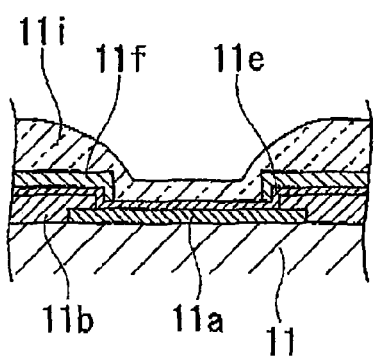
FIG. 12B is a cross-sectional view of the pad formed in the seventh step of the manufacturing method adapted to the three-axial magnetic sensor.
Figure 12C:
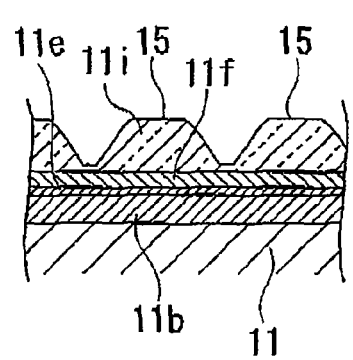
FIG. 12C is a cross-sectional view of the Y1-axis or Y2-axis GMR component formed in the seventh step of the manufacturing method adapted to the three-axial magnetic sensor.

In a seventh step of the manufacturing method as shown in FIGS. 12A to 12C, after completion of dry etching, the remaining portion of the resist film 11j is completely removed so as to form the projections 15 using the upper oxide film 11i for mounting the Y1-axis GMR component and the Y2-axis GMR component (see FIG. 11C). That is, slopes are formed in the upper oxide film 11i. FIGS. 12A to 12C do not precisely show that the other portion of the resist film 11j is subjected to dry etching so as to form the planar surface of the upper oxide film 11i for mounting the X-axis GMR component.

Figure 13A:
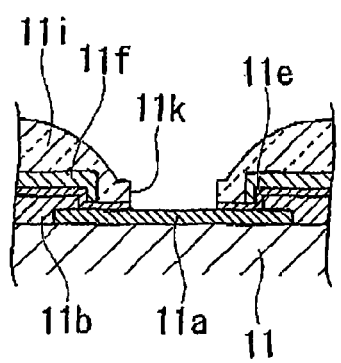
FIG. 13A is a cross-sectional view of the via formed in an eighth step of the manufacturing method adapted to the three-axial magnetic sensor.
Figure 13B:
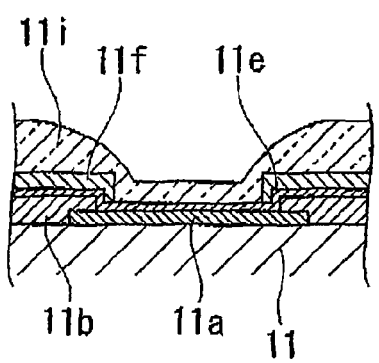
FIG. 13B is a cross-sectional view of the pad formed in the eighth step of the manufacturing method adapted to the three-axial magnetic sensor.
Figure 13C:
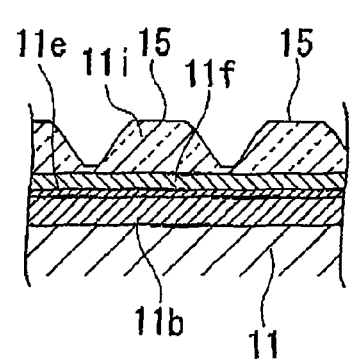
FIG. 13C is a cross-sectional view of the Y1-axis or Y2-axis GMR component formed in the eighth step of the manufacturing method adapted to the three-axial magnetic sensor.

In an eighth step of the manufacturing method as shown in FIGS. 13A to 13C, a resist is applied to the upper oxide film 11i and is then subjected to cutting so as to form a pattern forming an opening in the via; thereafter, it is subjected to etching. The remaining portion of the resist, which still remains irrespective of etching, is completely removed so that an opening 11k (see FIG. 13A) is formed in the via so as to expose the wiring layer 11a (which corresponds to an uppermost layer of the substrate 11). Herein, the prescribed portions of the oxide film 11e and the upper oxide film 11i above the wiring layer 11a may still remain in the pad irrespective of etching. Alternatively, etching is performed such that the oxide film 11e and the upper oxide film 11i are simultaneously removed so as to expose the wiring layer 11a in the pad similar to the via.

Figure 14A:
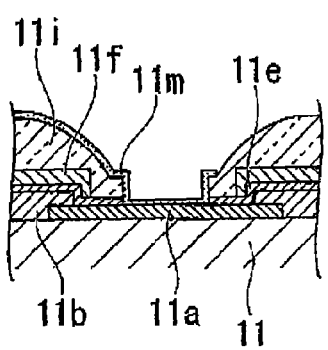
FIG. 14A is a cross-sectional view of the via formed in a ninth step of the manufacturing method adapted to the three-axial magnetic sensor.
Figure 14B:
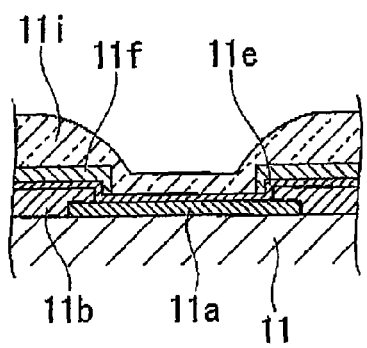
FIG. 14B is a cross-sectional view of the pad formed in the ninth step of the manufacturing method adapted to the three-axial magnetic sensor.
Figure 14C:
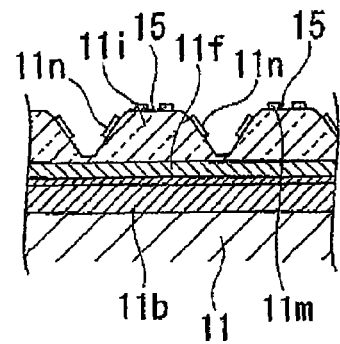
FIG. 14C is a cross-sectional view of the Y1-axis or Y2-axis GMR component formed in the ninth step of the manufacturing method adapted to the three-axial magnetic sensor.

In a ninth step of the manufacturing method as shown in FIGS. 14A to 14C, a lead film 11m composed of Cr (which may form the lead films 12a-5, 12a-6, 12a-7, 12a-8, and 12a-9 shown in FIG. 2A in the latter step) is formed on the upper oxide film 11i and the exposed portion of the wiring layer 11a in the via (see FIG. 14A) by way of sputtering, vacuum evaporation, or ion plating. Next, a resist is applied to the upper oxide film 11i and the lead film 11m and is then subjected to cutting in a prescribed pattern corresponding to the lead film 11m, which is ten subjected to etching.

In the above, the resist can be formed in a tapered shape in such a way that etching is appropriately performed on the slopes 15a and 15b of the projection 15, then, heat treatment is performed so as to reshape the cross-sectional shape of the projection 15. After completion of etching, the remaining portion of the resist, which still remains on the upper oxide film 11i, is removed.

Next, a GMR multilayered film 11n (which may form the GMR components 12a to 12d, 12e to 12h, and 12i to 12l in the latter step) is formed on the upper oxide film 11i and the lead film 11m by way of sputtering. This will be referred to as a GMR element forming step.

In the GMR element forming step, the GMR multilayered film 11n is formed by way of the formation of the laminated structure of FIG. 3A, in which the free layer (or free magnetic layer) F, the conductive spacer layer S composed of Cu having a 2.8 nm (28 Å) thickness, the pin layer (i.e., the fixed layer or fixed magnetization layer) P, and the capping layer C are sequentially laminated on the substrate 11.

In the above, the free layer F is constituted of the CoZrNb amorphous magnetic layer 12a-21 having a 8 nm (80 Å) thickness, the NiFe magnetic layer 12a-22 having a 3.3 nm (33 Å) thickness, and CoFe layer 12a-23 having a 1.2 nm (12 Å) thickness, which are sequentially laminated on the substrate 11.

In addition, the pin layer F is constituted of the first CoFe magnetic layer 12a-25 having a 3.2 nm (32 Å) thickness, the Ru layer 12a-26 having a 0.5 nm (5 Å) thickness, the second CoFe magnetic layer 12a-27 having a 2.2 nm (22 Å) thickness, and the antiferromagnetic layer 12a-28 having a 24 nm (240 Å) thickness (composed of a PtMn alloy including Pt ranging from 45 mol % to 55 mol %), which are sequentially laminated above the free layer F via the spacer layer S composed of Cu.

Figure 16:
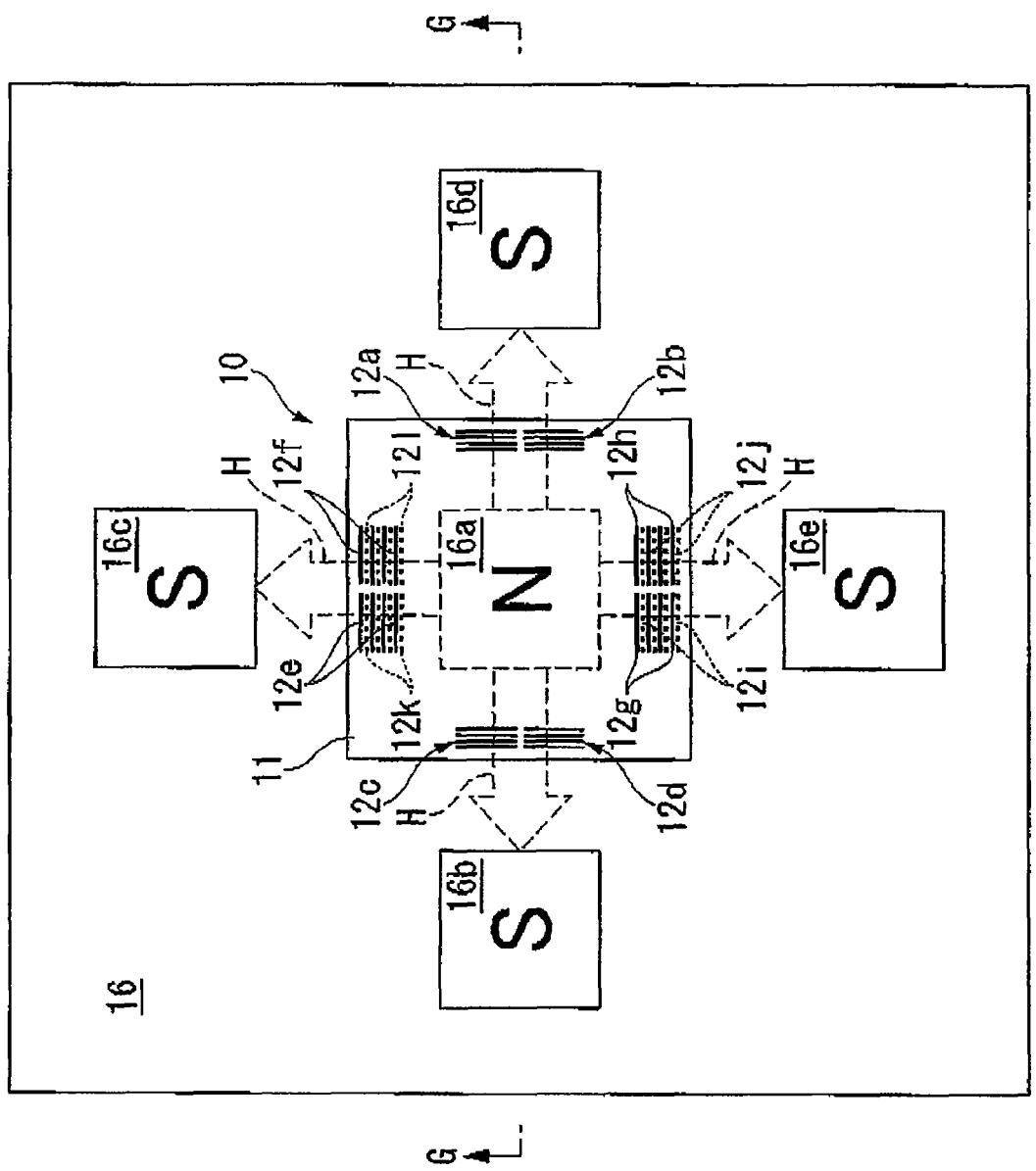
FIG. 16 is a plan view showing a permanent bar magnet array that is moved close to a substrate as shown in FIG. 14C so as to perform magnetization heat treatment (or pinning)

Thereafter, a permanent bar magnet array 16 shown in FIG. 16 is moved close to the substrate 11 having the GMR multilayered film 11n so as to perform magnetization heat treatment (or pinning), thus fixing the magnetization direction of the pin layer P. This will be referred to as a magnetization heat treatment step.

Then, a resist is applied to the surface of the GMR multilayered film 11n with a prescribed thickness, which is set to 2

μm in connection with the planar surface. A mask is placed on the surface of the resist and is then subjected to burning and development so as to remove unnecessary portions of the resist, thus forming a resist film whose pattern matches the pattern of the GMR multilayered film 11n (which will be formed in the latter step). In this case, the resist is formed in a tapered shape so as to appropriately perform etching of the projection 15 and to reshape the cross-sectional shape of the projection 15. Thereafter, the prescribed portion of the GMR multilayered film 11n, which is not protected by the resist film, is removed via ion milling and is thus formed in a prescribed shape (e.g., a plurality of thin band-like shapes).

Ion milling is performed such that both the GMR multilayered film 11n and the lead film 11m still remain in the via. This makes it possible to prevent the lead film 11m from being broken at the edge of the via.

Figure 15A:
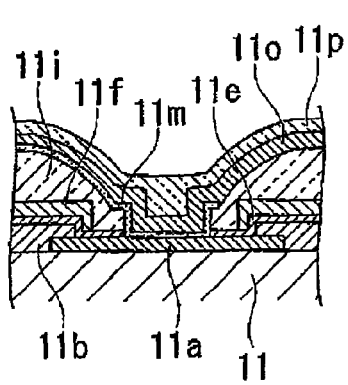
FIG. 15A is a cross-sectional view of the via formed in a tenth step of the manufacturing method adapted to the three-axial magnetic sensor.
Figure 15B:
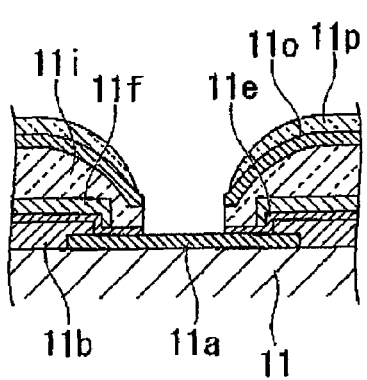
FIG. 15B is a cross-sectional view of the pad formed in the tenth step of the manufacturing method adapted to the three-axial magnetic sensor.
Figure 15C:
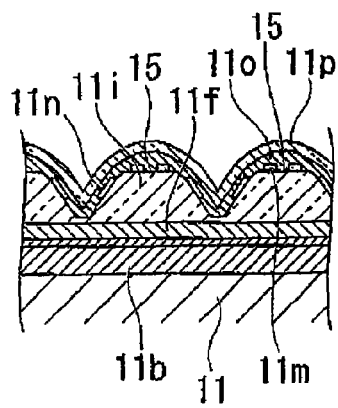
FIG. 15C is a cross-sectional view of the Y1-axis or Y2-axis GMR component formed in the tenth step of the manufacturing method adapted to the three-axial magnetic sensor.

In a tenth step of the manufacturing method as shown in FIGS. 15A to 15C, a silicon passivation film 11o, which includes an oxide film composed of $SiO_2$ having a 1500 Å thickness and a nitride film composed of $Si_3N_4$ having a 5000 Å thickness, are formed on the exposed portion of the oxide film 11e, the upper oxide film 11i, the lead film 11m, and the GMR multilayered film 11n by way of plasma CVD. A polyimide film 11p is flirter formed on the silicon passivation film 11o. Thus, it is possible to completely form a passivation film composed of the silicon passivation film 11o and the polyimide film 11p.

Using the polyimide film 11p as a mask, the silicon passivation film 11o and the oxide film 11e above the wiring layer 11a are removed by way of etching in the pad, which is thus opened so as to form an electrode pad using the exposed portion of the wiring layer 11a. Lastly the substrate 11 is subjected to cutting, thus completing the production of the three-axial magnetic sensor 10 shown in FIG. 1A.

The formation of the passivation film and electrode pad is not necessarily limited to the aforementioned procedures. For example, after the formation of the silicon passivation film 11o, the silicon passivation film 11o is removed by way of etching in the pad, which is thus opened so as to expose the prescribed portion of the wiring layer 11a. Next, the polyimide film 11p is formed on the silicon passivation film 11o and the wiring layer 11a so as to form the passivation film. Lastly the polyimide film 11p is removed by way of etching so as to expose the wiring layer 11a again in the pad, thus forming the electrode pad using the exposed portion of the wiring layer 11a.

Figure 17:
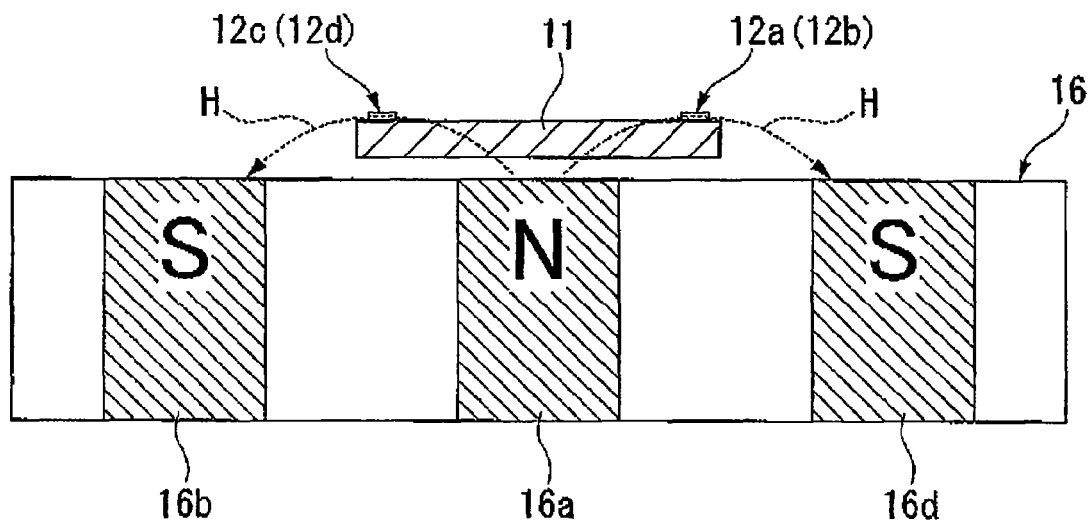
FIG. 17 is a cross-sectional view taken along line G-G in FIG. 16.

FIG. 17 is a cross-sectional view taken along line G-G in FIG. 16, which shows only five permanent bar magnets 16a to 16e in the permanent bar magnet array (or simply referred to as a magnet array) 16.

In the magnetization heat treatment (or pitting), the permanent bar magnet array 16 is positioned in proximity to the backside of the substrate 11 which is opposite to the GMR multilayered film 11n formed on the surface of the substrate 11; then, the substrate 11 and the permanent bar magnet array 16 are heated at a prescribed temperature ranging from 260° C. to 290° C. in the vacuum state, in which they are left alone for four hours.

In the permanent bar magnet array 16 shown in FIG. 16, the permanent bar magnets 16a to 16e are positioned in a lattice form in such a way that the polarity of the upper end of one permanent bar magnet differs from the polarity of the upper end of its adjacent permanent bar magnet. Herein, the permanent bar magnet 16a having N polarity on its upper end is positioned close to the center portion of the substrate 11, and the other permanent bar magnets 16b, 16c, 16d, and 16e each having S polarity on its upper end are positioned to surround the permanent bar magnet 16a in prescribed regions outside of the overall area range of the substrate 11.

Due to the aforementioned positioning of the permanent bar magnets 16a to 16e in the permanent bar magnet array 16 positioned relative to the substrate 11, four magnetic fields H are formed due to lines of magnetic forces, which are directed from the N polarity of the permanent bar magnet 16a (positioned just below the center portion of the substrate 11) to the S polarities of the permanent bar magnets 16b, 16c, 16d, and 16e in four directions (see dotted arrows in FIG. 16), which are shifted from each other in phase by 90°. The magnetic fields H are directed from the N polarity of the permanent bar magnet 16a so as to reach the backside of the substrate 11 and to be transmitted through the inside of the substrate 11, thus reaching the GMR components (e.g., the X-axis GMR components 12a to 12d, see FIG. 17).

Figure 18:
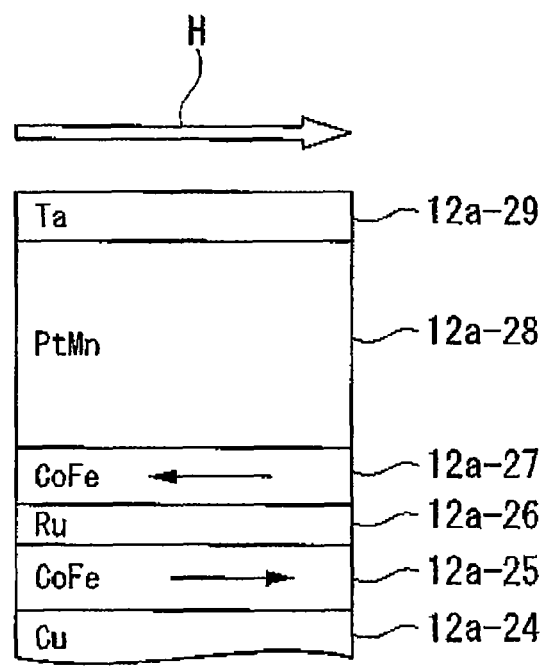
FIG. 18 diagrammatically shows the magnetization directions of the first and second CoFe magnetic layers included in the pin layer of the GMR component subjected to pinning.

The intensity of the magnetic field H to be transmitted through each GMR component will be described with reference to FIG. 18, which substantially shows the pin layer P included in the first X-axis GMR component 12a. That is, the intensity of the magnetic field H is set to a prescribed value (e.g., 10 mT or more, 200 mT or less, preferably, 20 mT or more, 80 mT or less) so that the magnetization direction of the first CoFe magnetic layer 12a-25 substantially matches the magnetization direction of the second CoFe magnetic layer 12a-27 so as to maintain the anti-parallel state of magnetization between the first and second CoFe magnetic layers 12a-25 and 12a-27, for example.

The first and second CoFe magnetic layers are composed of the same material, whereas the thickness of the first CoFe magnetic layer (32 Å) is larger than the thickness of the second CoFe magnetic layer (22 Å); hence, the magnetic moment of the first CoFe magnetic layer is higher than the magnetic moment of the second CoFe magnetic layer. For this reason, upon application of the aforementioned magnetic field, the first CoFe magnetic layer is magnetized in the same direction as the magnetic field H, while the second CoFe magnetic layer is magnetized in the direction opposite to the direction of the magnetic field H due to antiferromagnetic coupling with the first CoFe magnetic layer.

The Ru layer (e.g., 12a-26, see FIG. 18) sandwiched between the first and second CoFe magnetic layers is formed with a small thickness of 5 Å, which makes it possible to maintain the anti-parallel state of magnetization between the first and second CoFe magnetic layers even when the magnetic field H is increased in intensity. In other words, as the thickness of the Ru layer is reduced, it is possible to increase the intensity of the magnetic field H while maintaining the anti-parallel state of magnetization between the first and second CoFe magnetic layers.

The substrate 11 applied with the magnetic field H is heated at a temperature ranging from 260° C. to 290° C. for four hours in the vacuum state, whereby, as shown in FIG. 3B, the magnetization direction of the second CoFe magnetic layer 12a-27 is lined with the antiferromagnetic layer 12a-28 in a exchange coupling manner and is thus fixed to be opposite to the direction of the magnetic field H. The magnetization direction of the first CoFe magnetic layer 12a-25 is fixed in the same direction as the magnetic field H due to the antiferromagnetic connection with the second CoFe magnetic layer 12a-27. In short, the magnetization directions of the first and second CoFe magnetic layers 12a-25 and 12a-27 are fixed to their original directions that are established due to the magnetic field H applied thereto in the magnetization heat treatment.

Figure 19:
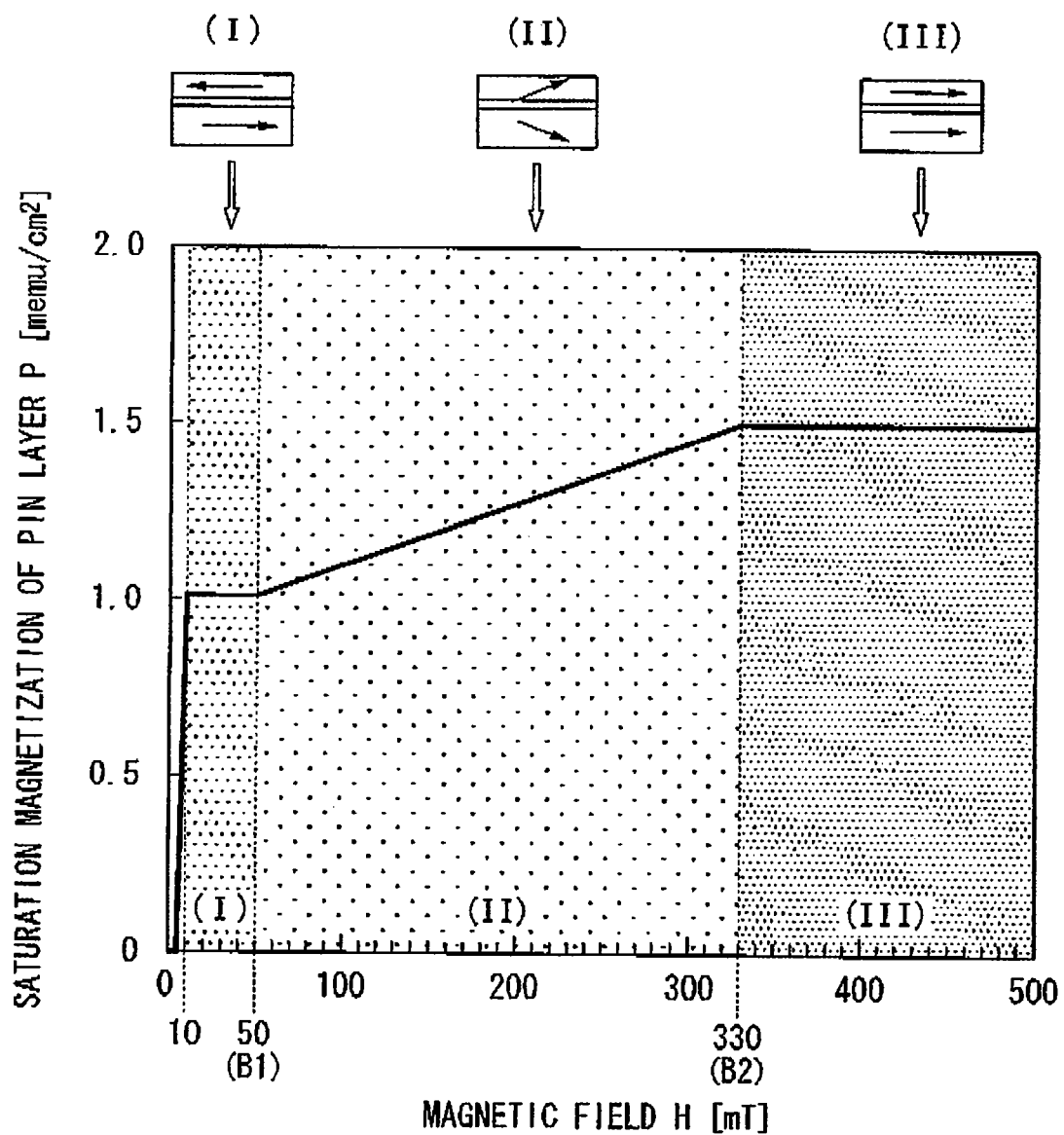
FIG. 19 is a graph showing the relationship between the intensity of a magnetic field applied to the pin layer of the GMR component subjected to pinning and the saturation magnetization of the pin layer under the condition in which the thickness of the Ru layer sandwiched between the first and second CoFe magnetic layers is set to 8 Å.

In FIG. 19, a region (I) indicates the range of the intensity of the magnetic field H maintaining the anti-parallel state of magnetization between the first and second CoFe magnetic layers 12a-25 and 12a-27 in the magnetization heat treatment. The graph of FIG. 19 shows the relationship between the intensity of the magnetic field H (see horizontal axis) and the saturation magnetization of the pin layer P (see vertical axis, which shows the sum of the magnetization intensities of the first and second CoFe magnetic layers 12a-25 and 12a-27 applied with the magnetic field H) in the condition in which the thickness of the Ru layer (e.g., 12a-26) is set to 8 Å. Herein, the magnetization intensity regarding each of the first and second CoFe magnetic layers 12a-25 and 12a-27 is represented in a positive value when its magnetization direction matches the direction of the magnetic field H but is represented in a negative value when its magnetization direction is opposite to the direction of the magnetic field H.

In the graph of FIG. 19, when the intensity of the magnetic field H lies in the region (I), the first and second CoFe magnetic layers 12a-25 and 12a-27 are magnetized in respective directions while the anti-parallel state of magnetization is maintained between the magnetization directions of the first and second CoFe magnetic layers 12a-25 and 12a-27. Herein, the magnetization vectors of the first and second CoFe magnetic layers 12a-25 and 12a-27 form an angle of 180° therebetween, wherein the magnetization intensity of the first CoFe magnetic layer 12a-25 is higher than the magnetization intensity of the second CoFe magnetic layer 12a-27 in the region (I). In short, the region (I) shows the preferable range of the intensity of the magnetic field H in the magnetization heat treatment in accordance with the present embodiment.

In a region (III) that is higher than the region (I) in terms of the intensity of the magnetic field H, both the first and second CoFe magnetic layers 12a-25 and 12a-27 are magnetized in the same direction as the magnetic field H so that the magnetization directions of the first and second CoFe magnetic layers 12a-25 and 12a-27 are set to a parallel state of magnetization. In short, the magnetization vectors of the first and second CoFe magnetic layers 12a-25 and 12a-27 form an angle of 0° therebetween in the region (III). The region (III) shows the range of the magnetic field H applied to the GMR component of the synthetic antiferromagnetic structure.

A region (II), which is higher than the region (I) but is lower than the region (III) in terms of the intensity of the magnetic field H, shows the transition from the anti-parallel state to the parallel state and the transition from the parallel state to the anti-parallel state with respect to the magnetization directions of the first and second CoFe magnetic layers 12a-25 and 12a-27. In the region (II), the magnetization vectors of the first and second CoFe magnetic layers 12a-25 and 12a-27 form an angle, which is more than 0° and less than 180°.

Figure 20:
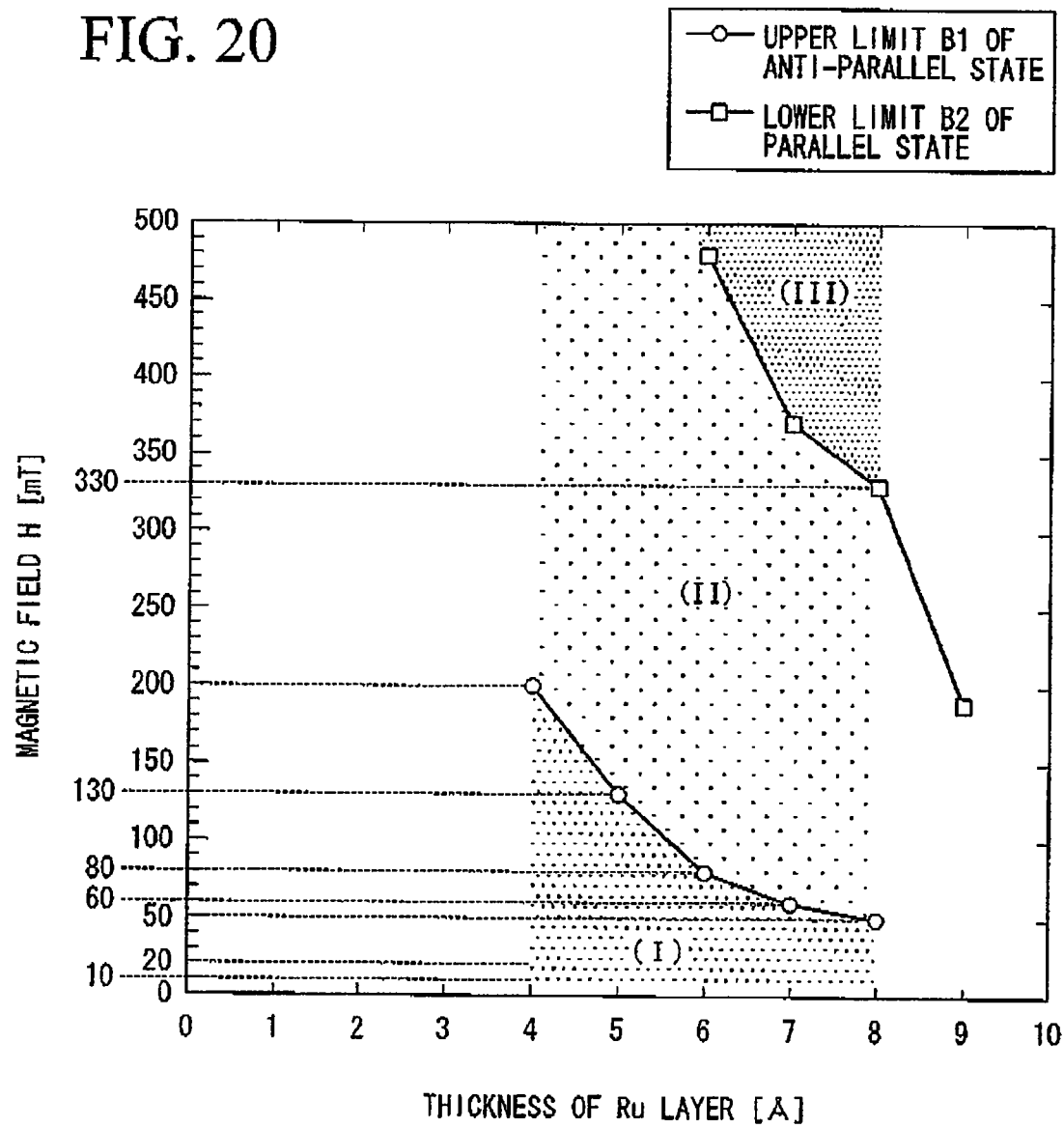
FIG. 20 is a graph showing the relationship between the thickness of the Ru layer and the intensity of the magnetic field applied to the GMR component in connection with the graph of FIG. 19.

FIG. 20 is a graph showing the relationship between the thickness of the Ru layer and the intensity of the magnetic field H applied to the pin layer P in connection with the graph of FIG. 19, wherein B1 designates variations of the upper-limit value of the intensity of the magnetic field H maintaining the anti-parallel state of magnetization in connection with the boundary between the regions (I) and (II) in FIG. 19, and B2 designates variations of the lower-limit value of the intensity of the magnetic field H maintaining the parallel state of magnetization in connection with the boundary between the regions (II) and (III) shown in FIG. 19. As shown in FIG. 20, the anti-parallel state upper-limit value B1 and the parallel state lower-limit value B2 vary in response to the thickness of the Ru layer, wherein as the thickness of the Ru layer becomes large, the values of both B1 and B2 become small.

Variations of the anti-parallel state upper-limit value B1 are smaller than variations of the parallel state lower-limit value B2 with respect to variations of the thickness of the Ru layer.

In the conventionally-known technology in which the magnetization heat treatment is performed using the magnetic field H whose intensity lies in the region (III), transition from the region (III) to the region (II) may easily occur due to small variations of the thickness of the Ru layer. In the present embodiment in which the magnetization heat treatment is performed using the magnetic field H whose intensity lies in the region (I), the magnetization directions of the first and second CoFe magnetic layers 12a-25 and 12a-27 still remain in the region (I) irrespective of small variations of the thickness of the Ru layer, wherein transition from the region (I) to the region (II) may hardly occur due to small variations of the thickness of the Ru layer. That is, by performing the magnetization heat treatment using the magnetic field H whose intensity lies in the region (I), it is possible to easily form desired GMR components without controlling the thickness of the Ru layer at high precision.

Due to the magnetization heat treatment of the present embodiment, it is possible to fix the magnetization directions of the pin layers P included in the X-axis GMR components 12a to 12d as shown in FIG. 4A in such a way that the magnetization directions of the X-axis GMR components 12a and 12b are each fixed to the positive X-axis direction, i.e., the directions a1 and b1, while the magnetization directions of the X-axis GMR components 12c and 12d are each fixed to the negative X-axis direction, i.e., the directions c1 and d1.

The magnetization directions of the pin layers P included in the Y1-axis GMR components 12e and 12f are each fixed to the positive Y-axis direction along the first slopes 15a of the projections 15 (see FIG. 4B), i.e., the directions e1 and f1. The magnetization directions of the pin layers P included in the GMR components 12g and 12h are each fixed to the negative Y-axis direction along the first slopes 15a of the projections 15 (see FIG. 4C), i.e., the directions g1 and h1.

The magnetization directions of the pin layers P included in the Y2-axis GMR components 12i and 12j are each fixed to the negative Y-axis direction along the second slopes 15b of the projections 15 (see FIG. 4C), i.e., the directions i1 and j1. The magnetization directions of the pin layers P included in the GMR components 12k and 12l are each fixed to the positive Y-axis direction along the second slopes 15b of the projections 15 (see FIG. 4B), i.e., the directions k1 and l1.

Unlike the conventionally-known technology, the manufacturing method of the three-axial magnetic sensor 10 does not need an intense magnetic field that is applied to GMR components and that is high enough to break the anti-parallel state of magnetization between the first and second CoFe magnetic layers. In the magnetization heat treatment of the present embodiment, a relatively weak magnetic field, which is lower than the conventionally-known magnetic field, is applied to GMR components so that variations of the magnetic field applied to GMR components become small relative to variations of the distance between the substrate 11 and the permanent bar magnet array 16; hence, it is unnecessary to precisely control the positioning of the permanent bar magnet array 16 relative to the substrate 11 at high precision and to precisely adjust the distance therebetween at high precision. This makes it possible to easily control the magnetization directions of the pin layers P in the magnetization heat treatment.

As described above, it is possible to easily fix the magnetization directions of the first and second CoFe magnetic layers to desired directions with respect to each of the pin layers P of the GMR components formed on the planar surfaces, and the first slopes 15a and the second slopes 15b of the projections 15 on the substrate 11; hence, it is possible to easily produce the three-axial magnetic sensor 10.

Since the thickness of the first CoFe magnetic layer is larger than the thickness of the second CoFe magnetic layer, it is possible to reliably increase the magnetic moment of the first CoFe magnetic layer to be higher than the magnetic moment of the second CoFe magnetic layer. That is, it is possible to fix the magnetization directions of the first and second CoFe magnetic layers to desired directions while maintaining the anti-parallel state of magnetization therebetween in the magnetization heat treatment.

Magnetic forces of the first and second CoFe magnetic layers included in the pin layer P are exerted on the free layer F, wherein they may include a exchange coupling force of the first CoFe magnetic layer and magnetostatic forces due to magnetic fields of the first and second CoFe magnetic layers. Since the magnetic moment of the first CoFe magnetic layer is increased to be higher than the magnetic moment of the second CoFe magnetic layer, it is possible to easily reduce the sum of the exchange coupling force and magnetostatic forces applied to the free layer F.

The intensities of the exchange coupling force and magnetostatic force of the first CoFe magnetic layer exerted on the free layer F can be made substantially identical to each other by appropriately adjusting the thickness of the spacer layer S, for example. When the magnetic moment of the second CoFe magnetic layer is decreased to be smaller than the magnetic moment of the first CoFe magnetic layer, it is possible to reduce the magnetostatic force of the second CoFe magnetic layer exerted on the free layer F to be lower than the exchange coupling force and magnetostatic force of the first CoFe magnetic layer.

The direction of the exchange coupling force of the first CoFe magnetic layer is opposite to the direction of the magnetostatic force of the first CoFe magnetic layer and is identical to the direction of the magnetostatic force of the second CoFe magnetic layer; hence, it is possible to easily reduce the sum of the exchange coupling force and magnetostatic force of the first CoFe magnetic layer exerted on the free layer F. That is, it is possible to reduce the influence of the magnetic forces of the first and second CoFe magnetic layers with respect to the magnetization direction of the free layer F; thus, it is possible to set a desired magnetization direction of the free layer F.

By reducing the thickness of the Ru layer, it is possible to increase the range of the intensity of the magnetic field H applied to the pin layer P while maintaining the anti-parallel state of magnetization between the first and second CoFe magnetic layers (see FIG. 20). This makes it possible to easily control the intensity of the magnetic field H in the magnetization heat treatment; hence, it is possible to easily control the magnetization directions with respect to the pin layer P.

In the magnetization heat treatment in which the permanent bar magnet array 16 is positioned close to the backside of the substrate 11, even when a relatively high magnetic field H is produced in proximity to the permanent bar magnet array 16, it is possible to easily reduce the intensity of the magnetic field H reaching the first and second CoFe magnetic layers of the pin layer P included in each GMR component because the permanent bar magnet array 16 is distanced from each GMR component by the thickness of the substrate 11.

Since the present embodiment is designed to reduce variations of the magnetic field H relative to variations of the distance between the substrate 11 and the permanent bar magnet away 16 (see FIG. 20), it is possible to easily control the intensity of the magnetic field H applied to each GMR component.

The present embodiment is not necessarily limited to the aforementioned values with regard to the thickness of the first and second CoFe magnetic layers and the Ru layer, wherein it is simply required that the thickness of the first CoFe magnetic layer be larger than the thickness of the second CoFe magnetic layer. In addition, it is possible to set different thicknesses to the first and second CoFe magnetic layers when the magnetic forces of the first and second CoFe magnetic layers exerted on the free layer F are not necessarily considered in manufacturing of the three-axial magnetic sensor 10. It is simply required that the thickness of the Ru layer be set to a prescribed value as long as it increases the range of the intensity of the magnetic field H maintaining the anti-parallel state of magnetization between the first and second CoFe magnetic layers. That is, it is preferable that the thickness of the Ru layer ranges from 4 Å to 10 Å.

The present embodiment is designed such that the Ru layer is directly sandwiched between the first and second CoFe magnetic layers both composed of the same material in the pin layer P; but this is not a restriction. That is, it is possible to form first and second magnetic layers composed of different materials. In this case, it is necessary to select appropriate materials such that the magnetic moment of the first magnetic layer differs from the magnetic moment of the second magnetic layer, wherein it is possible to set the same thickness to the first and second magnetic layers.

The present embodiment is designed such that the Y1-axis GMR component and Y2-axis GMR component are formed on the first slope 15a and the second slope 15b of the same projection 15; but this is not a restriction. It is simply required that the Y1-axis GMR component and Y2-axis GMR component be formed on different slopes, which are inclined in different directions; hence, it is possible to individually form them using different projections.

The present embodiment is designed such that the GMR components are formed on the planar surfaces of the substrate 11 as well as the first slopes 15a and the second slopes 15b of the projections 15 on the substrate 11, thus producing the three-axial magnetic sensor 10 sensing magnetic fields in three axial directions; but this is not a restriction. That is, the present embodiment can be adapted to two-axial magnetic sensors or one-axial magnetic sensors.

Lastly, the present invention is not necessary limited to the present embodiment, which can be further modified in a variety of ways without departing from the essentials thereof and within the scope of the invention as defined in the appended claims.

What is claimed is:

1. A manufacturing method of a magnetic sensor comprising the steps of:
    forming a free layer, a conductive layer, and a pin layer, which are sequentially laminated on a substrate, so as to form a giant magnetoresistive element, wherein a first magnetic layer, an Ru layer, a second magnetic layer, and an antiferromagnetic layer are sequentially laminated on the conductive layer so as to form the pin layer; and
    performing magnetization heat treatment for applying a magnetic field to the pin layer so as to fix its magnetization direction, wherein the first magnetic layer and the second magnetic layer are magnetized while maintaining magnetization directions thereof in an anti-parallel state of magnetization, and wherein the strength of the magnetic field is between 10 mT and 200 mT.

2. The manufacturing method of a magnetic sensor according to claim 1, wherein the pin layer is formed in such a way that the first magnetic layer differs from the second magnetic layer in thickness.

3. The manufacturing method of a magnetic sensor according to claim 1, wherein a thickness of the first magnetic layer is larger than a thickness of the second magnetic layer.

4. The manufacturing method of a magnetic sensor according to claim 1, wherein the pin layer is formed in such a way that a thickness of the Ru layer ranges from 4 Å to 10 Å.

5. The manufacturing method of a magnetic sensor according to claim 1, wherein a magnet array producing the magnetic field is positioned in proximity to a backside of the substrate whose surface arranges the giant magnetoresistive element.

6. The manufacturing method of a magnetic sensor according to claim 1, wherein a first giant magnetoresistive element and a second giant magnetoresistive element, which differ from each other in sensitivity direction, are formed on the substrate, on which a planar surface and at least one slope are formed in advance, in such a way that the first giant magnetoresistive element is formed using the planar surface, and the second giant magnetoresistive element is formed using the at least one slope.

7. A magnetic sensor comprising:
a substrate; and
a plurality of giant magnetoresistive elements, each of which includes a free layer, a conductive layer, and a pin layer sequentially laminated on a surface of the substrate,
wherein the pin layer includes a first magnetic layer, an Ru layer, a second magnetic layer, and an antiferromagnetic layer, which are sequentially laminated together on the conductive layer, wherein the magnetization directions of the first and second magnetic layers are maintained in an anti-parallel state of magnetization by applying a magnetic field with a strength between 10 mT and 200 mT during a heat treatment, and
wherein a magnetic moment of the first magnetic layer differs from a magnetic moment of the second magnetic layer.

8. A magnetic sensor according to claim 7, wherein the first magnetic layer differs from the second magnetic layer in thickness.

9. A magnetic sensor according to claim 7, wherein the magnetic moment of the first magnetic layer is higher than the magnetic moment of the second magnetic layer.

10. A magnetic sensor according to claim 7, wherein a thickness of the Ru layer ranges from 4 Å to 10 Å.

11. A magnetic sensor according to claim 7, wherein the plurality of giant magnetoresistive elements include a first giant magnetoresistive element and a second giant magnetoresistive element, which differ from each other in sensitivity direction, wherein a planar surface and at least one slope are formed on the substrate, and wherein the first giant magnetoresistive element is formed using the planar surface, and the second giant magnetoresistive element is formed using the at least one slope.

* * * * *